United States Patent
Shi

(10) Patent No.: US 10,243,057 B2
(45) Date of Patent: Mar. 26, 2019

(54) MISHFET HAVING A COMPARATIVELY HIGH AND SELECTABLE OR CUSTOMIZABLE BREAKDOWN VOLTAGE

(71) Applicant: The Board of Trustees of The University Of Illinois, Urbana, IL (US)

(72) Inventor: Junxia Shi, Chicago, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 15/293,529

(22) Filed: Oct. 14, 2016

(65) Prior Publication Data

US 2017/0117401 A1    Apr. 27, 2017

Related U.S. Application Data

(60) Provisional application No. 62/245,427, filed on Oct. 23, 2015.

(51) Int. Cl.
*H01L 29/51* (2006.01)
*H01L 29/20* (2006.01)
(Continued)

(52) U.S. Cl.
CPC ........ *H01L 29/513* (2013.01); *H01L 29/2003* (2013.01); *H01L 29/511* (2013.01); *H01L 29/7786* (2013.01); *H01L 29/4236* (2013.01)

(58) Field of Classification Search
CPC ................ H01L 29/511; H01L 29/513; H01L 29/2003; H01L 29/7786; H01L 29/4236
See application file for complete search history.

(56) References Cited

U.S. PATENT DOCUMENTS 6,724,025 B1 * 4/2004 Takashima ........ H01L 21/28194
257/288
8,450,774 B2    5/2013 Shi et al.
(Continued)

OTHER PUBLICATIONS

Kuzmik, J., "Power electronics on InAlN/(In)GaN: prospect for a record performance," IEEE Electron Device Lett., vol. 22, No. 11, pp. 510-512 (Nov. 2001).
(Continued)

*Primary Examiner* — Laura M Menz
*Assistant Examiner* — Candice Chan
(74) *Attorney, Agent, or Firm* — Marshall Gerstein & Borun LLP

(57) ABSTRACT

Representative embodiments provide an InAlN/GaN MISHFET having a predetermined breakdown voltage, calibrated to a permittivity-thickness parameter and selectable before or during transistor fabrication, which can be greater than 700 V for a normally-off InAlN/GaN MISHFET. Representative embodiments include a first dielectric layer coupled to a gate and to an InAlN barrier layer, a second dielectric layer, and an optional third dielectric layer. The first dielectric layer comprises a first dielectric material having a first predetermined thickness and a first relative permittivity. The second dielectric layer comprises a second dielectric material having a second predetermined thickness and a second relative permittivity, with the second relative permittivity greater than or equal to twenty (20), such as $HfO_2$, $HfAlO_x$, $HfSiO_x$, $SrTiO_2$ (STO), $HfTiO_2$, $HfYO_x$, $Er_2O_3$, $Y_2O_3$, $TiO_2$, $ErTiO_x$, $Er_xTi_{1-x}O_y$; $AlTiO_x$, $SrTiO_3$, tantalum oxide, zirconium oxide, barium strontium titanate, barium strontium oxide, strontium oxide, and combinations thereof.

14 Claims, 14 Drawing Sheets

(51) Int. Cl.
  *H01L 29/778* (2006.01)
  *H01L 29/423* (2006.01)

(56) References Cited

U.S. PATENT DOCUMENTS 8,946,779 B2 2/2015 Green et al.
2014/0291775 A1* 10/2014 Oka .................. H01L 29/518
257/411

OTHER PUBLICATIONS

Kuzmik et al., "Analysis of degradation mechanisms in lattice-matched InAlN/GaN high-electronmobility transistors," J. Appl. Phys. vol. 106, pp. 124503-1-124503-7 (2009).
Alomari et al., "InAlN/ GaN MOSHEMT with self-aligned thermally generated oxide recess," IEEE Electron Device Lett. 30 1131-3 (Nov. 2009).
Zhou et al., "Schottky source/drain InAlN/AlN/GaN MISHEMT with enhanced breakdown voltage," IEEE Electron Device Lett., vol. 33, pp. 38-40 (Jan. 2012).
Maier et al., "InAlN/GaN HEMTs for operation in the 1000° C. regime: a ?rst experiment," IEEE Electron Device Lett., vol. 33, No. 7, pp. 985-987 (Jul. 2012).
Kuzmik et al., "Off-state breakdown in InAlN/AlN/GaN high electron mobility transistors," Phys. Status Solidi C, vol. 6, No. S2, pp. S925-S928 (2009).
Saito et al., "Over 550 V breakdown voltage of InAlN/GaN HEMT on Si," Phys. Status Solidi C, vol. 10, No. 5, pp. 824-826 (2013).
Zhou et al., "Schottky-contact technology in InAlN/GaN HEMTs for breakdown voltage improvement," IEEE Trans. Electron Devices, vol. 60, No. 3, pp. 1075-1081 (Mar. 2013).
Morgan et al., "Enhancement-mode insulating-gate AlInN/AlN/ GaN heterostructure ?eld-effect transistors with threshold voltage in excess of +1.5 V," Appl. Phys. Express 4, pp. 114101-1-114101-3 (2011).
Yagi et al., High breakdown voltage AlGaN/GaN MIS-HEMT with SiN and TiO2 gate insulator; Solid-State Electron. vol. 50, pp. 1057-1061 (2006).
Fu-Tong et al., "Improved breakdown voltage in AlGaN/GaN high electron mobility transistors by employing polyimide/chromium composite thin ?lms as surface passivation and high-permittivity ?eld plates," Chin. Phys. Lett. vol. 30 No. 9, pp. 097303-1-097303-4 (2013).
Tipirneni et al., "The 1.6 kV AlGaN/GaN HFETs," IEEE Electron Device Lett. vol. 27, No. 9, pp. 716-718 (Sep. 2006).
Bahat-Treidel et al., "Punchthrough-voltage enhancement of AlGaN/ GaN HEMTs Using AlGaN double-heterojunction con?nement," IEEE Trans. Electron Devices, vol. 55, No. 12, pp. 3354-3359 (Dec. 2008).
Shi et al., "High performance AlGaN/GaN power switch with HfO2 insulation," Appl. Phys. Lett. vol. 95; pp. 042103-1-042103-3 (2009).
Oguzman et al., "Theory of hole initiated impact ionization in bulk zincblende and wurtzite GaN," J. Appl. Phys. vol. 81, No. 12, pp. 7827-7834 (Jun. 1997).
Tang et al., "Influence of acceptor-like traps in the buffer on current collapse and leakage of E-mode AlGaN/ GaN MISHFETs," Semicond. Sci. Technol. vol. 28, 115011, pp. 1-9 (2013).
Tapajna et al. "A comprehensive analytical model for threshold voltage calculation in GaN based metal-oxide-semiconductor high-electron-mobility transistors," Appl. Phys. Lett. vol. 100, pp. 113509-1-113509-4 (2012).
Li et al., "Fermi-level stabilization energy in group III nitrides," Phys. Rev. B, vol. 71, pp. 161201-1-161201-4 (R) (2005).
Xin et al., "Demonstration of low-leakage-current low-on-resistance 600 V 5.5 A GaN/AlGaN HEMT," IEEE Electron Device Lett., vol. 30, No. 10, pp. 1027-1029 (Oct. 2009).
Green et al., "The effect of surface passivation on the microwave characteristics of undoped AlGaN/GaN HEMTs," IEEE Electron Device Lett., vol. 21, No. 6, pp. 268-270 (Jun. 2000).
Dang et al., "Influence of surface processing and passivation on carrier concentrations and transport properties in AlGaN/GaN heterostructures," J. Appl. Phys. vol. 90, No. 3, pp. 1357-1361 (Aug. 1, 2001).
Tsurumi et al., "AlN passivation over AlGaN/ GaN HFETs for surface heat spreading," IEEE Trans. Electron Devices, vol. 57, No. 5, pp. 980-985 (May 2010).
Hashizume et al., "Suppression of current collapse in insulated gate AlGaN/GaN heterostructure field effect transistors using ultrathin Al2O3 dielectric," Appl. Phys. Lett. vol. 83, No. 14, pp. 2952-2954 (Oct. 6, 2003).
Qian et a., "Performance of La2O3/InAlN/GaN metal-oxide-semiconductor high electron mobility transistors," Chin. Phys.B, vol. 21, No. 6, pp. 067305-1-067305-6 (2012).
Xu et al., "Atomic layer deposition and characterization of amorphous ErxTi1?xOy dielectric ultra-thin ?lms," ECS J. Solid State Sci. Technol. 1 (6), pp. N107-N114 (2012).
Pei et al., "Effect of dielectric thickness on power performance of AlGaN/GaN HEMTs," IEEE Electron Device Lett. vol. 30, No. 4, pp. 313-315 (Apr. 2009).
Lee et al., "Bi-layer SixNy passivation on AlGaN/GaN HEMTs to suppress current collapse and improve breakdown," Semicond. Sci. Technol. 25 125010, pp. 1-5, (2010).
Lo et al., "Effects of silicon nitride passivation on isolation-blocking voltage in algan/ gan high electron mobility transistors," J. Vac. Sci. Technol. B, vol. 29(3), pp. 031211-1-031211-5 (May/Jun. 2011).
Aggarwal et al., "Improved linearity performance of AlGaN/GaN MISHFET over conventional HFETs: An optimization study for wireless infrastructure applications," Superlattices and Microstructures, vol. 50, pp. 1-13 (2011).
Cho et al., "AlN/AlGaN/GaN Metal Insulator Semiconductor Heterostructure Field Effect Transistor," Jpn. J. Appl. Phys. vol. 41, pp. 4481-4483 (Jul. 2002).
Lee et al., "AlGaN/GaN metal-insulator-semiconductor heterostructure field-effect transistor with an in-situ AlN cap layer," Applied Physics Letters vol. 99, pp. 153505-1-153505-3 (2011).
Hu et al., "Si3N4/AlGaN/GaN-metal-insulator-semiconductor heterostructure field-effect transistors," Applied Physics Letters, vol. 79, No. 17, pp. 2832-2834 (Oct. 22, 2001).
Mishra, Umesh, "AlGaN/GaN HEMTs on semi-insulating GaN substrates by MOCVD and MBE," UC Santa Barbara Contract No. N00014-05-1-0135, Document No. 20091029314, pp. 1-11.

* cited by examiner

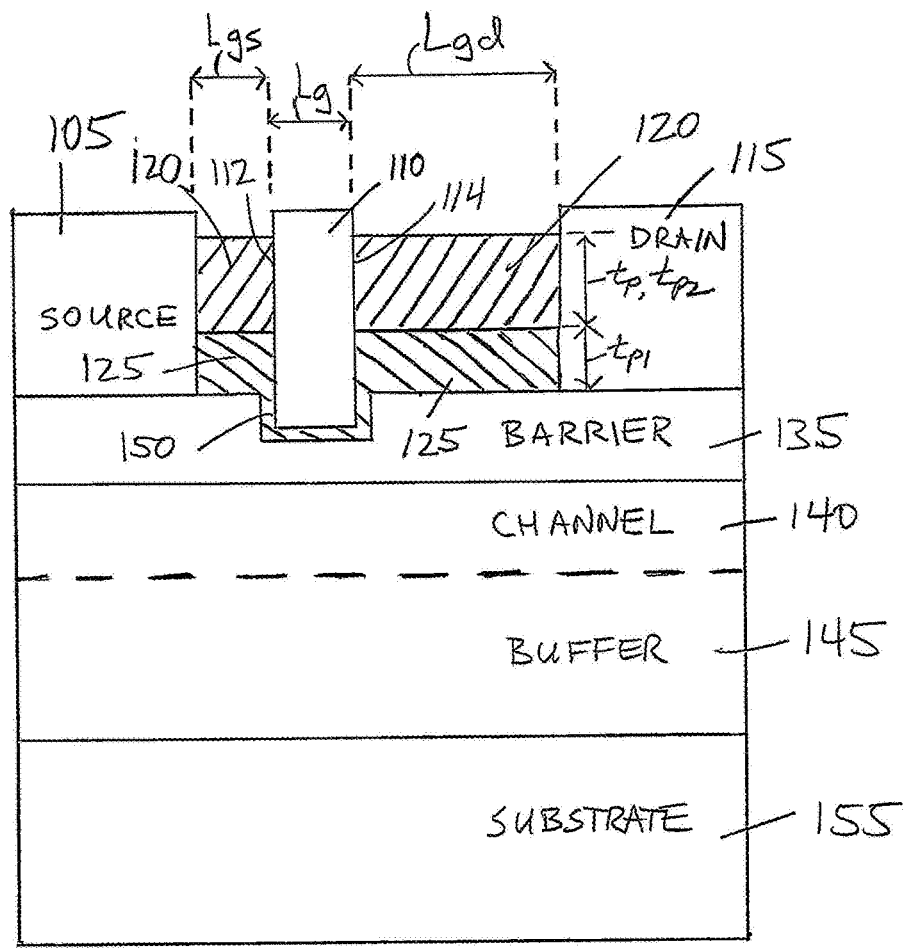
FIG. 1

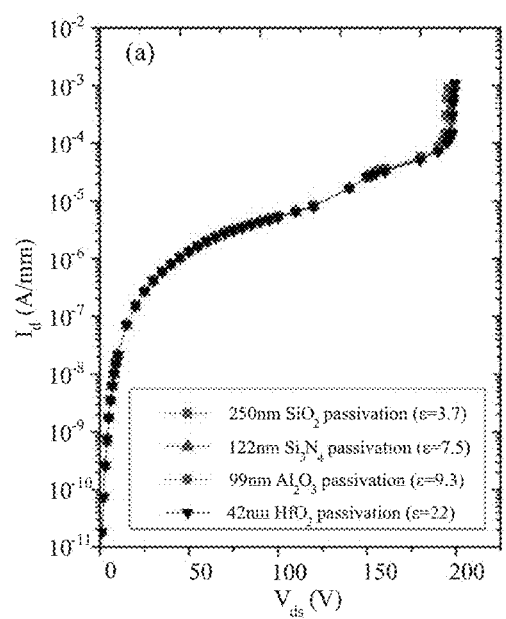
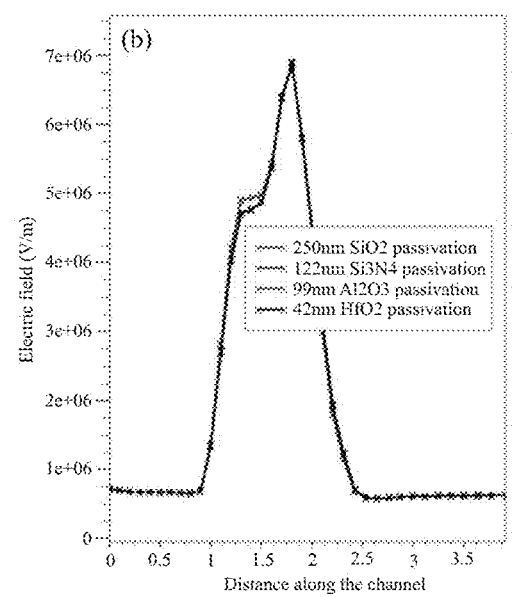
FIG. 8A                     FIG. 8B

_US 10,243,057 B2_

MISHFET HAVING A COMPARATIVELY HIGH AND SELECTABLE OR CUSTOMIZABLE BREAKDOWN VOLTAGE

CROSS-REFERENCE TO A RELATED APPLICATION

This application is a nonprovisional of and claims the benefit of and priority to U.S. Provisional Patent Application No. 62/245,427, filed Oct. 23, 2015, inventor Junxia Shi, titled "High Breakdown Voltage Normally-off Devices", which is commonly assigned herewith, and all of which is hereby incorporated herein by reference in its entirety with the same full force and effect as if set forth in its entirety herein.

FIELD OF THE INVENTION

The present invention, in general, relates to a metal-insulator-semiconductor heterostructure (or heterojunction) field-effect transistor ("MISHFET"), and more particularly, relates to an InAlN/GaN MISHFET having a comparatively high and selectable or customizable breakdown voltage.

BACKGROUND OF THE INVENTION

The InAlN/GaN heterostructure has been predicted to be capable of delivering high current and high power densities due to its strong spontaneous polarization. An $In_xAl_{1-x}N$ barrier (where x is between 0 and 1), moreover, can be grown lattice matched to a GaN buffer layer, such as at an indium mole-fraction x=0.17 (about a 17% indium molar fraction and 83% aluminum fraction of the InAlN), allowing fewer structural defects than the AlGaN/GaN lattice mismatched heterostructure, providing less strain and therefore decreased current collapse (or slump) following multiple on/off switching events or cycles. Although there has been significant progress in the development of InAlN/GaN high electron mobility transistors ("HEMTs", also referred to as heterostructure field-effect transistors ("HFETs")) for high drive current, low on-resistance, and reliability in ultrahigh temperature environment, the comparatively low breakdown voltage ("BV") of these InAlN/GaN devices severely limits the device performance and their potential applications.

As a result, one of the most significant problems with InAlN/GaN devices is the comparatively very low breakdown voltages, or early breakdown, which is typically less than 200V. This is not suitable for many applications, such as the power switches in smart grids, or hybrid or electric cars, factory automation, wind turbines and wind mills, for example.

Breakdown voltages ranging from 350 to 650 V and relatively high leakage currents ranging from $10^{-5}$ to $10^{-4}$ A/mm have recently been demonstrated in normally-on devices. BV and leakage current of normally-off InAlN/GaN devices, however, are even worse than their normally-on counterparts. For example, one of the very few normally-off InAlN/GaN MISHFETs showed a BV of 345 V at $L_{GD}$=4.5 μm with a comparatively high leakage current of $0.8 \times 10^{-3}$ A/mm. Normally-off operation, however, is much preferred for simpler circuits as well as for safety concerns, especially for high voltage power conversion applications.

Accordingly, a need remains to significantly improve the breakdown voltage and reduce the leakage current of normally-off InAlN/GaN devices. In addition, such a normally-off InAlN/GaN device should still provide suitable performance characteristics for other device parameters, such as sufficient frequency response, a comparatively high on-current, and an absence of current collapse when repeatedly switched on and off.

BRIEF SUMMARY OF THE INVENTION

The representative embodiments of the present invention provide numerous advantages. The representative apparatus and method embodiments provide a significantly more robust InAlN/GaN MISHFET, with a comparatively high and selectable or customizable (or tunable) breakdown voltage, which may be greater than 800V for a normally-off InAlN/GaN MISHFET, and having comparatively low leakage current, comparatively high on-state current density, and comparatively minimal current collapse.

A representative embodiment of an InAlN/GaN metal-insulator-semiconductor heterostructure field-effect transistor ("MISHFET") having a predetermined breakdown voltage selectable before or during transistor fabrication is disclosed. Depending upon the selected embodiment, the representative InAlN/GaN MISHFETs may be normally-off or normally-on. Such a representative embodiment of an InAlN/GaN MISHFET may comprise: a substrate; a GaN buffer layer coupled to the substrate, the GaN buffer layer further comprising a channel; an InAlN barrier layer coupled to the GaN buffer layer; a first dielectric layer coupled to the InAlN barrier layer, the first dielectric layer comprising a first dielectric material having a first predetermined thickness and a first relative permittivity; a gate coupled to the first dielectric layer and disposed in a recess in the InAlN barrier layer, the gate having a first side and a second side opposite the first side; a source coupled to the InAlN barrier layer and spaced apart from the first side of the gate; a drain coupled to the InAlN barrier layer and spaced apart from the second side of the gate; and a second dielectric layer coupled to the first dielectric layer, to the gate, to the source and to the drain, the second dielectric layer comprising a second dielectric material having a second predetermined thickness and a second relative permittivity, the second relative permittivity greater than or equal to twenty (20).

Another representative embodiment of an InAlN/GaN metal-insulator-semiconductor heterostructure field-effect transistor ("MISHFET") having a predetermined breakdown voltage selectable before or during transistor fabrication is disclosed, comprising: a substrate; a GaN buffer layer coupled to the substrate, the GaN buffer layer further comprising a channel; an InAlN barrier layer coupled to the GaN buffer layer; a first dielectric layer coupled to the InAlN barrier layer, the first dielectric layer comprising a first dielectric material having a first predetermined thickness and a first relative permittivity, such as the first relative permittivity being less than or equal to thirty (30); a gate coupled to the first dielectric layer, the gate having a first side and a second side opposite the first side; a source coupled to the InAlN barrier layer and spaced apart from the first side of the gate; a drain coupled to the InAlN barrier layer and spaced apart from the second side of the gate; and a second dielectric layer coupled to the first dielectric layer, to the gate, to the source and to the drain, the second dielectric layer comprising a second dielectric material having a second predetermined thickness and a second relative permittivity, the second relative permittivity greater than or equal to twenty (20), wherein the predetermined breakdown voltage is calibrated to and corresponds a multiplicative product of the second relative permittivity multiplied by the second predetermined thickness.

Another representative embodiment of a normally-off InAlN/GaN metal-insulator-semiconductor heterostructure field-effect transistor ("MISHFET") having a predetermined breakdown voltage selectable before or during transistor fabrication is disclosed, comprising: a substrate; a GaN buffer layer coupled to the substrate, the GaN buffer layer further comprising a channel; an InAlN barrier layer coupled to the GaN buffer layer; a first dielectric layer coupled to the InAlN barrier layer, the first dielectric layer comprising a first dielectric material having first predetermined thickness and a first relative permittivity, the first dielectric material selected from the group consisting of: $HfO_2$, $Al_2O_3$, $Si_3N_4$, $HfAlO_x$, $HfSiO_x$, and combinations thereof a gate coupled to the first dielectric layer and arranged in a recess in the InAlN barrier layer, the gate having a first side and a second side opposite the first side; a source coupled to the InAlN barrier layer and spaced apart from the first side of the gate; a drain coupled to the InAlN barrier layer and spaced apart from the second side of the gate; a second dielectric layer coupled to the first dielectric layer, to the gate, to the source, and to the drain, the second dielectric layer comprising a second dielectric material having a second predetermined thickness and a second relative permittivity, the second dielectric material selected from the group consisting of: $HfO_2$, $HfAlO_x$, $HfSiO_x$, $SrTiO_2$ (STO), $HfTiO_2$, $HfYO_x$, $Er_2O_3$, $Y_2O_3$, $TiO_2$, $ErTiO_x$, $Er_xTi_{1-x}O_y$; $AlTiO_x$, $SrTiO_3$, tantalum oxide, zirconium oxide, barium strontium titanate, barium strontium oxide, strontium oxide, and combinations thereof and a third dielectric layer coupled to the second dielectric layer, the third dielectric layer comprising a third dielectric material selected from the group consisting of: $Si_3N_4$, $SiO_2$, AlN, $Al_2O_3$, and combinations thereof.

In a representative embodiment, the predetermined breakdown voltage is calibrated to and corresponds with a permittivity-thickness parameter selected before or during fabrication of the InAlN/GaN MISHFET, with the permittivity-thickness parameter comprising a multiplicative product of the second relative permittivity multiplied by the second predetermined thickness. In a representative embodiment, the second dielectric material and the second predetermined thickness are each selectable variables to jointly determine the predetermined breakdown voltage. For example, the predetermined breakdown voltage is increased before or during fabrication of the InAlN/GaN MISHFET by selecting a second dielectric material having an increased second relative permittivity, or an increased second predetermined thickness, or both an increased second relative permittivity and an increased second predetermined thickness.

In a representative embodiment, the first predetermined thickness is between 10 nm and 20 nm and the second predetermined thickness is between 100 nm and 2000 nm.

In a representative embodiment, the second dielectric material has a second relative permittivity between 30 and 350.

In another representative embodiment, the second dielectric layer comprises $TiO_2$, the second predetermined thickness is greater than 400 nm, and the predetermined breakdown voltage is greater than 750V.

In another representative embodiment, the second dielectric layer comprises $Er_xTi_{1-x}O_y$, the second predetermined thickness is greater than 200 nm, and the predetermined breakdown voltage is greater than 600V.

In a representative embodiment, the first dielectric layer comprises a first dielectric material selected from the group consisting of: $HfO_2$, $Al_2O_3$, $Si_3N_4$, $HfAlO_x$, $HfSiO_x$, and combinations thereof.

In a representative embodiment, the second dielectric layer comprises a second dielectric material selected from the group consisting of: $HfO_2$, $HfAlO_x$, $HfSiO_x$, $SrTiO_2$ (STO), $HfTiO_2$, $HfYO_x$, $Er_2O_3$, $Y_2O_3$, $TiO_2$, $ErTiO_x$, $Er_xTi_{1-x}O_y$; $AlTiO_x$, $SrTiO_3$, tantalum oxide, zirconium oxide, barium strontium titanate, barium strontium oxide, strontium oxide, and combinations thereof.

A representative embodiment may further comprise: a third dielectric layer coupled to the second dielectric layer, the third dielectric layer having a third relative permittivity less than twenty (20). For example, the third dielectric layer may comprises a dielectric material selected from the group consisting of: $Si_3N_4$, $SiO_2$, AlN, $Al_2O_3$, and combinations thereof.

A representative embodiment of a method of fabricating the InAlN/GaN MISHFET to have a selectable, predetermined breakdown voltage is also disclosed, comprising: selecting the predetermined breakdown voltage; using calibration data, mapping the selected predetermined breakdown voltage to a corresponding permittivity-thickness parameter of a plurality of permittivity-thickness parameters; selecting a second dielectric material to form the second dielectric layer, the selected material having the second relative permittivity; determining the second thickness of the second dielectric layer as a quotient of the corresponding permittivity-thickness parameter divided by the second relative permittivity of the selected second dielectric material; and during transistor fabrication, depositing the second dielectric layer comprising the second dielectric material to at least the second thickness.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIG. 1 is a schematic, cross-sectional view of a representative first embodiment of a metal-insulator-semiconductor heterostructure (or heterojunction) field-effect transistor ("MISHFET") having a comparatively high and selectable or customizable breakdown voltage.

FIGS. 8A and 8B (collectively referred to as FIG. 8) are graphical diagrams illustrating voltage and current breakdown characteristics (FIG. 8A) and off-state electric field distribution (FIG. 8B) of a normally-off InAlN/GaN MISHFET with second (or upper) dielectric layers having similar permittivity-thickness product values but comprising different materials and thicknesses.

DETAILED DESCRIPTION OF REPRESENTATIVE EMBODIMENTS

Figure 2:
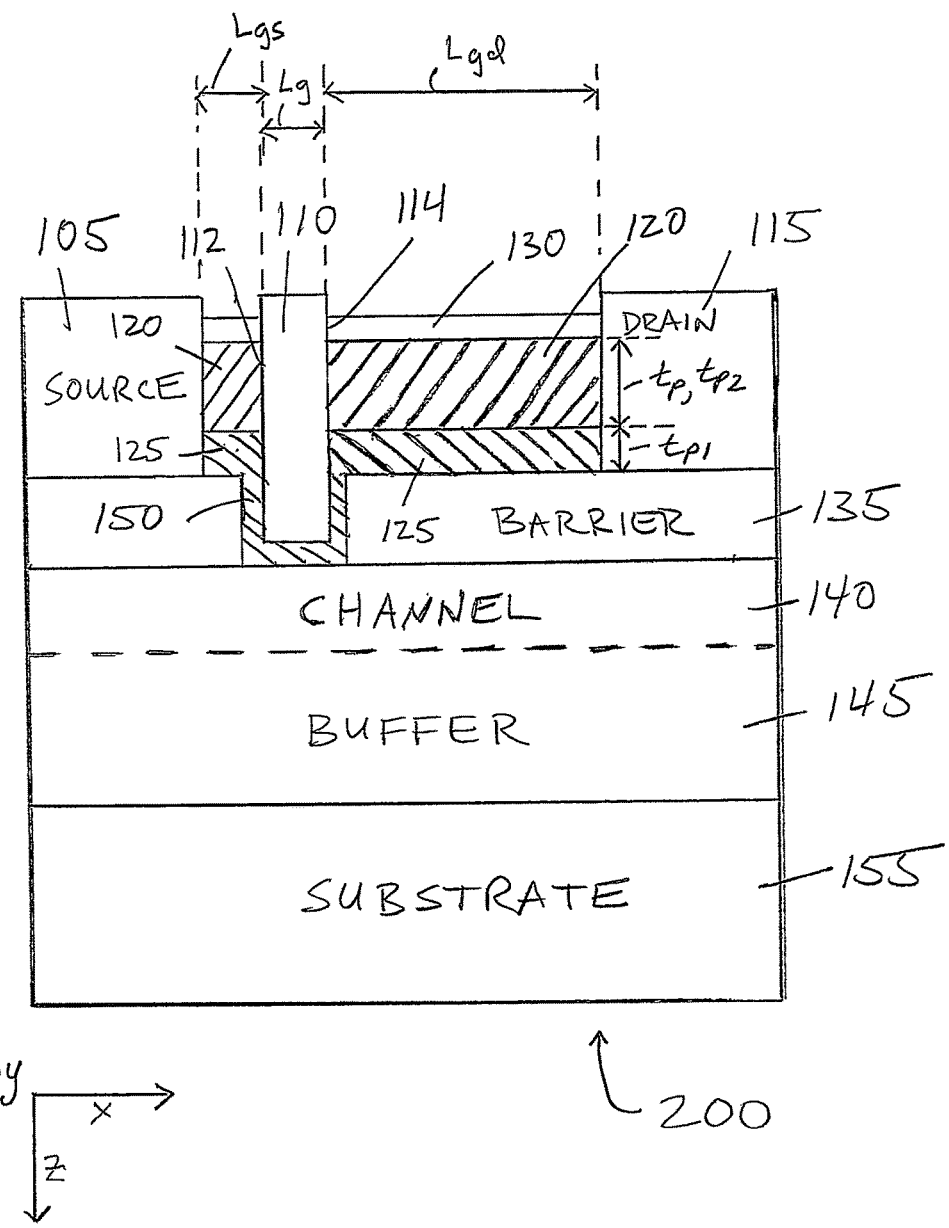
FIG. 2 is a schematic, cross-sectional view of a representative second embodiment of a metal-insulator-semiconductor heterostructure (or heterojunction) field-effect transistor ("MISHFET") having a comparatively high and selectable or customizable breakdown voltage.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As mentioned above and as discussed in greater detail below, the representative apparatus, system and method embodiments provide for a MISHFET 100, 200, 300 in which a permittivity-thickness parameter ($\varepsilon x t_p$) of a second (or upper) dielectric layer 120 is directly utilized to select and customize the BV and drain leakage in representative MISHFETs 100, 200, 300. A much smoother distribution of the electric field in the channel has been observed in InAlN/GaN MISHFETs 100, 200, 300 with a higher value of the permittivity-thickness parameter. Therefore, avalanche multiplication effect at high V$_{ds}$ can be efficiently suppressed to a great extent, and pronounced improvement of the breakdown voltage can be achieved. Compared to an InAlN/GaN MISHFET without any second (or upper) dielectric layer 120, the BV of a MISHFET 100, 200, 300 with a second (or upper) dielectric layer 120 comprising TiO$_2$ with a thickness of 450 nm, and using 15 nm HfO$_2$ for the first dielectric layer 125, as a passivation stack, increases the breakdown voltage from less than 50V to over 750V, with leakage current on the level of μA/mm.

Figure 3:
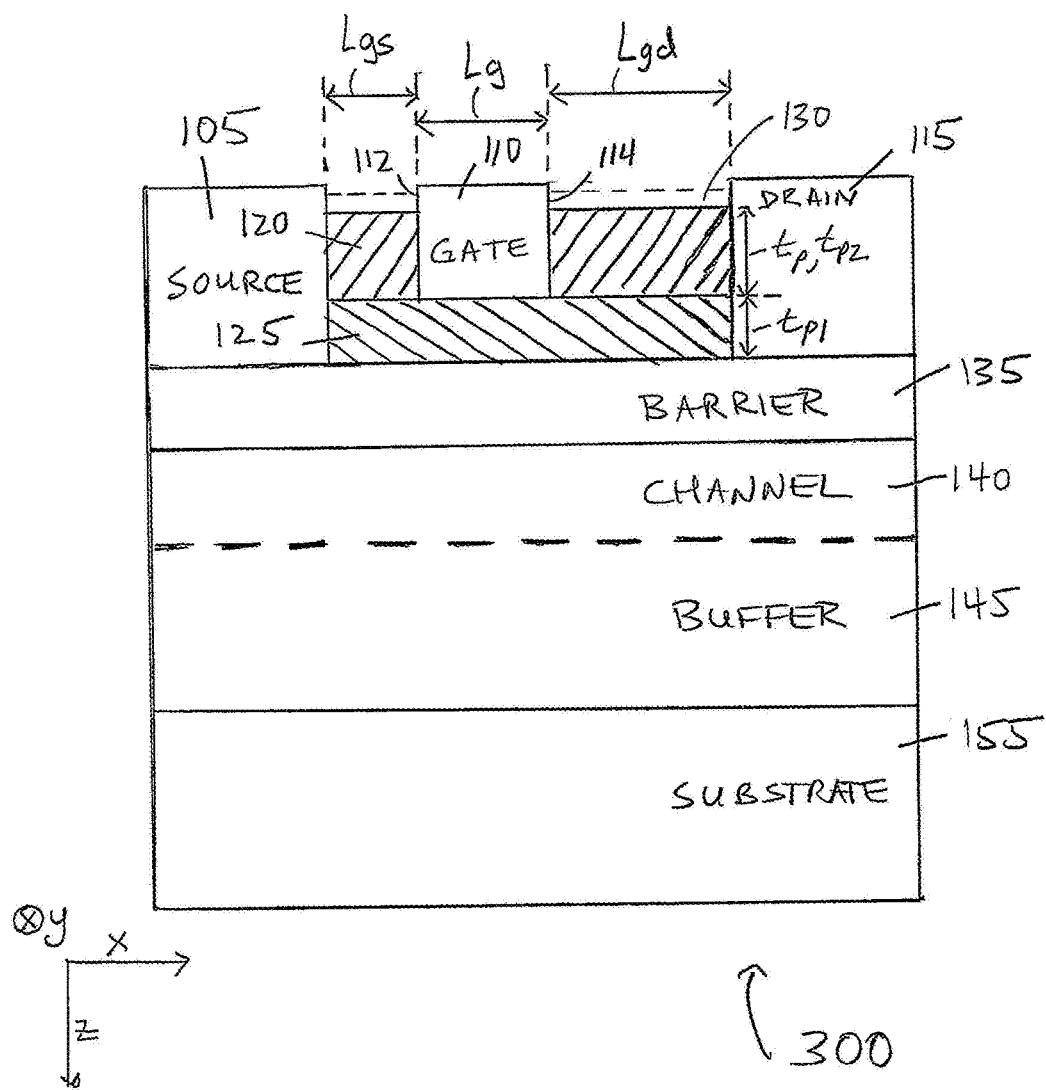
FIG. 3 is a schematic, cross-sectional view of a representative third embodiment of a metal-insulator-semiconductor heterostructure (or heterojunction) field-effect transistor ("MISHFET") having a comparatively high and selectable or customizable breakdown voltage.

FIG. 1 is a schematic, cross-sectional view of a representative first embodiment of a MISHFET 100 having a comparatively high and selectable or customizable breakdown voltage. FIG. 2 is a schematic, cross-sectional view of a representative second embodiment of a MISHFET 200 having a comparatively high and selectable or customizable breakdown voltage. FIG. 3 is a schematic, cross-sectional view of a representative third embodiment of a MISHFET 300 having a comparatively high and selectable or customizable breakdown voltage. The MISHFETs 100, 200, 300 are substantially planar integrated circuit devices, and may be fabricated using known epitaxial, chemical vapor deposition, resist layers, masking, and other fabrication techniques, for example and without limitation. As is customary in the field, the MISHFETs 100, 200, 300 are illustrated and described using schematic, cross-sectional views (illustrated with an "x" dimension for length and a "z" dimension for depth or thickness), and further illustrated having a gate-to-drain length ("L$_{gd}$"), a gate-to-source length ("L$_{gs}$"), and a gate length ("L$_g$"), also as customary in the field.

As illustrated in FIGS. 1-3, each of the MISHFETs 100, 200, 300 comprise a buffer layer 145 which is contiguous with, disposed on and coupled to a substrate 155, with the buffer layer 145 further comprising a channel 140 (or, equivalently, a channel layer 140); a barrier layer 135 which is contiguous with, disposed on and coupled to the buffer layer 145, with the channel 140 typically comprising a comparatively thin (e.g., 10 nm) interface formed between the barrier layer 135 and the buffer layer 145; a first (or lower) dielectric layer 125 which is contiguous with, disposed on and coupled to the barrier layer 135; a gate 110 which disposed on and coupled to a portion of the first (or lower) dielectric layer 125; a second (or upper) dielectric layer 120 which disposed on and coupled to the first (or lower) dielectric layer 125; a source 105 which is contiguous with, disposed on and coupled to the barrier layer 135 and further adjacent and coupled to the first and second dielectric layers 125, 120 on a first side; and a drain 115 which is contiguous with, disposed on and coupled to the barrier layer 135 and further adjacent and coupled to the first and second dielectric layers 125, 120 on a second side opposite the first side. Those having skill in the art will recognize that multiple MISHFETs 100, 200, 300 may be fabricated on the same substrate 155. Those having skill in the art will also recognize that the channel 140 (or channel layer 140) is generally considered to be part of the buffer layer 145 rather than an additional layer that might be deposited separately, for example and without limitation, and is merely demarcated as part of the buffer layer 145 in FIGS. 1-3 using a dashed line.

Continuing to refer to FIGS. 1-3, it should be noted that the first (or lower) dielectric layer 125 also extends laterally (x-y dimensions) between a first side 112 of the gate 110 and the source 105 and also between a second side 114 of the gate 110 and the drain 115. Similarly, the second (or upper) dielectric layer 120 also extends laterally (x-y dimensions) between a first side 112 of the gate 110 and the source 105 and also between a second side 114 of the gate 110 and the drain 115. It should also be noted that depending upon the topology of the MISHFET 100, 200, 300, the first (or lower) dielectric layer 125 and/or the second (or upper) dielectric layer 120 may or may not be continuous layers extending laterally, but may be laterally separated by either side of the gate 110, for example and without limitation.

As illustrated in FIGS. 1 and 2, the gate 110 is recessed, provided (with the first (or lower) dielectric layer 125) in a recess 150 of the (InAlN) barrier layer 135, to provide a normally-off (or enhancement mode) MISHFET 100, 200. In various embodiments, such as illustrated in FIG. 2 as an available variation for both MISHFET 100, 200 embodiments, the recess 150 may extend completely through the barrier layer 135, such that there is no barrier layer 135 directly below the gate 110, with only the first (or lower) dielectric layer 125 extending between the gate 110 and the channel 140. As illustrated in FIG. 3, the gate 110 is not recessed, to provide a normally-on (or depletion mode) MISHFET 300. For each of these MISHFET 100, 200, 300 embodiments, at least a portion of the first (or lower) dielectric layer 125 is arranged or disposed between the gate 110 and the barrier layer 135, as the gate 110 insulator.

The first and second dielectric layers 125, 120 also may be referred to equivalently as passivation layers. They are referred to herein as first and second dielectric layers 125, 120, however, to distinguish that the first and second dielectric layers 125, 120 of the MISHFETs 100, 200, 300 typically are each comprised of a selected material having a comparatively high permittivity (ε) or relative permittivity ("$\varepsilon_r$"), or equivalently, a comparatively high dielectric constant ("k"), compared to prior art devices and further compared to the third (uppermost) dielectric (or passivation) layer 130. For example and without limitation, the first and second dielectric layers 125, 120 may be comprised of one or more selected materials having a range of relative permittivities of about 20-80 or more, e.g., either may comprise HfO$_2$ having a relative permittivity ($\varepsilon_r$) of about 22, or either may comprise TiO$_2$ having a relative permittivity ($\varepsilon_r$) of about 80, compared to the considerably lower relative permittivity of other materials typically utilized in a passivation layer, such as SiO$_2$ ($\varepsilon_r$=3.7), Si$_3$N$_4$ ($\varepsilon_r$=7.5), AlN ($\varepsilon_r$=8.5), or Al$_2$O$_3$ ($\varepsilon_r$=9.3). In a representative embodiment, the first and second dielectric layers 125, 120 may be comprised of any selected material having any relative permittivity ("$\varepsilon_r$") greater than 5, or more particularly, greater than 7, or more particularly, greater than 10, or more particularly, greater than 12, or more particularly, greater than 15, or more particularly, greater than 17, or more particularly, greater than 20, or more particularly, greater than 21, or more particularly, equal to or greater than 22. It should also be noted that each of the first and second dielectric layers 125, 120 may be comprised of multiple sublayers, and any such sublayers may be comprised of the same or different selected materials having corresponding relative permittivities. Any of the various layers of the MISHFET 100, 200, 300 embodiments may also be formed as laminates having multiple sublayers.

The first (or lower) dielectric layer 125 also provides or forms the gate 110 insulation, and is typically deposited in a comparatively thin layer, e.g., having a 15 nm thickness, e.g., using atomic layer deposition (ALD). In a representative embodiment, the first (or lower) dielectric layer 125 may have a range of thicknesses, including for example and without limitation, such as between about 5 nm to 30 nm thick, or more particularly between about 10 to 20 nm thick. In various representative embodiments, the first (or lower) dielectric layer 125 may comprise, for example and without limitation, a first dielectric material such as HfO$_2$, Al$_2$O$_3$, Si$_3$N$_4$, HfAlO$_x$, HfSiO$_x$, and combinations thereof. Alternatively, the first (or lower) dielectric layer 125 may comprise any of the (second) dielectric materials utilized for the second dielectric layer 120. In a representative embodiment, the first (or lower) dielectric layer 125 comprises HfO$_2$ and is about 15 nm thick, for example and without limitation. While a comparatively high dielectric constant (k) (relative permittivity ($\varepsilon_r$)) may be desirable for the first (or lower) dielectric layer 125, the quality of the resulting interface with the barrier layer 135, and the dielectric strength of the first (or lower) dielectric layer 125 (while maintaining a comparatively high dielectric constant (k)) are generally considered to be more important factors in the selection of the material forming the first (or lower) dielectric layer 125. For example and without limitation, when the first (or lower) dielectric layer 125 comprises HfO$_2$, the first dielectric layer 125 has a relative permittivity greater than 20, such as between 20 and 100, or more particularly, between 20 and 25, such as about 22. It will be understood by those with skill in the art that other materials, thicknesses or combinations may be used for the first (or lower) dielectric layer 125, and any and all such materials, thicknesses and combinations are within the scope of the disclosure.

The second (or upper) dielectric layer 120 is completely new and novel in MISHFET structures. The second (or upper) dielectric layer 120 is generally deposited over the first (or lower) dielectric layer 125, such as using chemical vapor deposition, pulsed laser deposition, sputtering, or evaporation. In a representative embodiment, the second (or upper) dielectric layer 120 may have a wide range of thicknesses, depending upon the relative permittivity of the material selected to form the second (or upper) dielectric layer 120 and depending upon the selected BV or range of BVs desired for a MISHFET 100, 200, 300, as discussed in greater detail below, including for example and without limitation, between about 50 nm to 3,000 nm, or more particularly, between about 50 nm to 2,000 nm, or more particularly, between about 100 nm to 2,000 nm, or more particularly, between about 300 nm to 1,000 nm, or more particularly, between about 100 nm to 1,000 nm, or more particularly, greater than 100 nm, or more particularly, greater than 200 nm, or more particularly, greater than 300 nm, or more particularly, greater than 400 nm, or more particularly, greater than 500 nm, or more particularly, greater than 600 nm, or more particularly, greater than 700 nm, or more particularly, greater than 800 nm, or more particularly, greater than 900 nm. As discussed in greater detail below, for a selected BV or range of breakdown voltages, when the second (or upper) dielectric layer 120 comprises a material having a comparatively greater relative permittivity, the thickness of the second (or upper) dielectric layer 120 may be smaller, while when the second (or upper) dielectric layer 120 comprises a material having a comparatively lower relative permittivity, the thickness of the second (or upper) dielectric layer 120 may be greater.

In a representative embodiment, the second (or upper) dielectric layer 120 may comprise, for example and without limitation, a second dielectric material such as $HfO_2$, $HfAlO_x$, $HfSiO_x$, $SrTiO_2$ (STO), $HfTiO_2$, $HfYO_x$, $Er_2O_3$, $Y_2O_3$, $TiO_2$, $ErTiO_x$, $AlTiO_x$, $SrTiO_3$, tantalum oxide, zirconium oxide, barium strontium titanate, barium strontium oxide, strontium oxide, and combinations thereof. In a representative embodiment, the second (or upper) dielectric layer 120 may comprise, for example and without limitation, various semiconductor polymers and/or conjugated polymers, such as an organic semiconductor selected from the group consisting of: π-conjugated polymers, poly(acetylene)s, poly (pyrrole)s, poly(thiophene)s, polyanilines, polythiophenes, poly(p-phenylene sulfide), poly(para-phenylene vinylene)s (PPV) and PPV derivatives, poly(3-alkylthiophenes), polyindole, polypyrene, polycarbazole, polyazulene, polyazepine, poly(fluorene)s, polynaphthalene, polyaniline, polyaniline derivatives, polythiophene, polythiophene derivatives, polypyrrole, polypyrrole derivatives, polythianaphthene, polythianaphthane derivatives, polyparaphenylene, polyparaphenylene derivatives, polyacetylene, polyacetylene derivatives, polydiacethylene, polydiacetylene derivatives, polyparaphenylenevinylene, polyparaphenylenevinylene derivatives, polynaphthalene, polynaphthalene derivatives, polyisothianaphthene (PITN), polyheteroarylenvinylene (ParV) in which the heteroarylene group is thiophene, furan or pyrrol, polyphenylene-sulphide (PPS), polyperinaphthalene (PPN), polyphthalocyanine (PPhc), and their derivatives, copolymers thereof and mixtures thereof, and combinations thereof. It will be understood by those with skill in the art that other materials, thicknesses or combinations may be used for the second (or upper) dielectric layer 120, and any and all such materials, thicknesses and combinations are within the scope of the disclosure.

In a representative embodiment, the second (or upper) dielectric layer 120 comprises $TiO_2$ or $HfO_2$. In a representative embodiment, the second (or upper) dielectric layer 120 may be comprised of any selected material having any relative permittivity ("$\varepsilon_r$") greater than 20, or more particularly, greater than 30, or more particularly, greater than 40, or more particularly, greater than 50, or more particularly, greater than 60, or more particularly, greater than 70, or more particularly, equal to or greater than 80, for example and without limitation. In a representative embodiment, the second (or upper) dielectric layer 120 is comprised of a selected material having a relative permittivity between about 20 and 100,000, or more particularly, between about 30 and 10,000, or more particularly, between about 30 and 8,000, or more particularly, between about 30 and 6,000, or more particularly, between about 30 and 5,000, or more particularly, between about 30 and 1,000, for example and without limitation.

It should be noted that the first and second dielectric layers 125, 120 may comprise the same or different selected materials and may have the same or different permittivities or relative permittivities. For example, the first (or lower) dielectric layer 125 may comprise $HfO_2$, and the second (or upper) dielectric layer 120 may comprise $TiO_2$, respectively having different first and second relative permittivities. In another example, the first (or lower) dielectric layer 125 may comprise $HfO_2$, and the second (or upper) dielectric layer 120 also may comprise $HfO_2$, having the same relative permittivities. The first and second dielectric layers 125, 120 may also include any of various dopants. For example and without limitation, if doped $TiO_2$ is used, it may be doped with Er or with other elements.

As further illustrated in FIG. 2, an optional third (uppermost) dielectric (or passivation) layer 130 is also provided, which is contiguous with, disposed on and coupled to the second (or upper) dielectric layer 120. Such an optional third (uppermost) dielectric (or passivation) layer 130 would be the typical passivation (e.g. silicon nitride) provided in prior art devices directly over the gate 110 insulator (e.g., over a first (or lower) dielectric layer 125), but specifically without any intervening second (or upper) dielectric layer 120 as provided herein. For example, in a representative embodiment, the third (uppermost) dielectric (or passivation) layer 130 comprises a third dielectric material selected from the group consisting of: $Si_3N_4$, $SiO_2$, AlN, $Al_2O_3$, and combinations thereof. Such an optional third (uppermost) dielectric (or passivation) layer (or film) 130 is also typically comparatively thick (with the various Figures not being drawn to scale), such as being about 1-2 microns in thickness, especially compared to the much thinner first (or lower) dielectric layer 125 and barrier layer 135 (e.g., each typically being about 15 nm in thickness), and also typically thicker than the second (or upper) dielectric layer 120.

Although the breakdown mechanisms of InAlN/GaN and/or AlGaN/GaN have not been defined, the first and second dielectric layers 125, 120 are utilized herein to successfully avoid low breakdown voltages of the MISHFETs 100, 200, 300, in addition to suppressing current collapse or slump and reducing leakage currents. In accordance with the representative embodiments, the product of the relative permittivity ($\varepsilon_r$) and thickness(es) of the second dielectric layer 125 (or both the second and first dielectric layers 120, 125) of the MISHFETs 100, 200, 300 are utilized for selection or customization of the breakdown voltage (BV), such as to create a comparatively high BV. It is possible that this improvement of the BV, with the addition of the second (or upper) dielectric layer 120 in accordance with the representative embodiments, may be due to efficient alleviation of the peak electric field at the gate 110 edge.

More specifically, and as discussed in greater detail below, in accordance with the representative embodiments, a multiplicative product referred to herein as the "permittivity-thickness parameter" (abbreviated "PT,") is created and defined as a selectable or customizable (or tunable) parameter, namely: the permittivity-thickness parameter is the multiplicative product of the relative permittivity ($\varepsilon_r$, or equivalently, the dielectric constant k) of the selected material comprising the second (or upper) dielectric layer 120 multiplied by the thickness "$t_P$" of the second (or upper)

dielectric layer 120, using relative permittivity $\varepsilon_r$, as Equation 1:

$$PT_r = \varepsilon_r \cdot t_P \quad (1).$$

Equivalently, the permittivity-thickness parameter may be defined using permittivity ($\varepsilon$) rather than relative permittivity) (i.e., permittivity as the product of the relative permittivity multiplied by the absolute permittivity ($\varepsilon = \varepsilon_r \cdot \varepsilon_0$) (and abbreviated "PT" to distinguish it from $PT_r$), and will differ merely by a factor of $\varepsilon_0$ (i.e., $PT = PT_r \cdot \varepsilon_0$), provided as Equation 2:

$$PT = \varepsilon \cdot t_P = PT_r \cdot \varepsilon_0 \quad (2).$$

The permittivity-thickness parameter PT will having units of capacitance (e.g., pF) when permittivity is utilized; when relative permittivity (which is unitless) is utilized, the permittivity-thickness parameter $PT_r$ will have units of length, such as nanometers. The thickness "$t_P$" (160) of the second (or upper) dielectric layer 120 is illustrated in FIGS. 1-3, and is defined in the z-dimension, orthogonal to the plane (x and y dimensions) of the planar MISHFETs 100, 200, 300, which is consistent with the practice of the semiconductor device fabrication field. The thickness "$t_P$" (160) of the second (or upper) dielectric layer 120 is illustrated in FIGS. 1-3, and is defined in the z-dimension, orthogonal to the plane (x and y dimensions) of the planar MISHFETs 100, 200, 300, which is consistent with the practice of the semiconductor device fabrication field.

Because use of relative permittivity is much more common in the electronic arts, the permittivity-thickness parameter as used and referred to herein will utilize relative permittivity (Equation 1) rather than permittivity (Equation 2), and it will be understood to mean and includes its mathematically-equivalent variants, such as the use of permittivity rather than relative permittivity, as those having skill in the art will recognize that one may be converted to the other, as described above, and merely differ by a factor of $\varepsilon_0$ (e.g., $PT = PT_r \cdot \varepsilon_0$ and $PT_r = PT/\varepsilon_0$).

It should be noted that in another representative embodiment, the thickness and relative permittivity of the selected material forming the first (or lower) dielectric layer 125 may also be included in the permittivity-thickness parameter, e.g., as Equation 3:

$$TP_r = \varepsilon_{r1} \cdot t_{P1} + \varepsilon_{r2} \cdot t_{P2} \quad (3);$$

in which $\varepsilon_{r1}$ is the relative permittivity of the selected material comprising the first (or lower) dielectric layer 125, "$t_{P1}$" is the thickness of the first (or lower) dielectric layer 125, $\varepsilon_{r2}$ is the relative permittivity of the selected material comprising the second (or upper) dielectric layer 120, and "$t_{P2}$" is the thickness of the second (or upper) dielectric layer 120, as illustrated in FIGS. 1-3. The permittivity of the selected material comprising the second (or upper) dielectric layer 120 and the thickness "$t_{P2}$" of the second (or upper) dielectric layer 120, however, are much more significant for increasing, selecting and/or customizing the breakdown voltage of the MISHFETs 100, 200, 300 (i.e., the product $\varepsilon_{r2} \cdot t_{P2}$ is much greater than the product $\varepsilon_{r1} \cdot t_{P1}$ ($\varepsilon_{r2} \cdot t_P \gg \varepsilon_{r1} \cdot t_{P1}$)). In addition, there are also typically structural constraints or limitations on the thickness and material selection for the first (or lower) dielectric layer 125, such as to provide the insulating layer for a recessed gate 110, along with other factors such as quality of the resulting interface with the barrier layer 135 and the dielectric strength of the first (or lower) dielectric layer 125, as mentioned above.

With that in mind, the thickness and dielectric material selection for the first (or lower) dielectric layer 125 are generally not available as variables for customizing or tuning the breakdown voltage in a MISHFET 100, 200, 300, and may be viewed either as constants or as minimally contributing to the overall permittivity-thickness parameter (e.g., $TP_r = \varepsilon_{r1} \cdot t_{P1} + \varepsilon_{r2} \cdot t_{P2}$ reduces to $TP_r \approx \varepsilon_{r2} \cdot t_{P2}$ when ($\varepsilon_{r2} \cdot T_{P2} \gg \varepsilon_{r1} \cdot t_{P1}$)). Accordingly, in a representative embodiment, unless expressly provided to the contrary, the permittivity-thickness parameter is specifically defined and utilized in accordance with Equation 1, as equal to the multiplicative product of the relative permittivity ($\varepsilon_r$, or equivalently, the dielectric constant k) of the selected material comprising the second (or upper) dielectric layer 120 and the thickness "$t_P$" of the second (or upper) dielectric layer 120 (i.e., the permittivity-thickness parameter $PT_r = \varepsilon_r \cdot t_P$, or equivalently, the permittivity-thickness parameter $PT_r = \varepsilon_{r2} \cdot t_{P2}$). In addition, as mentioned above, permittivity may always be substituted equivalently for relative permittivity.

As discussed in greater detail below, in accordance with the representative embodiments, the selected material (having a corresponding relative permittivity ($\varepsilon_r$ or $\varepsilon_{r2}$) and the selected thickness ($t_p$ or $t_{p2}$) of the second (or upper) dielectric layer 120 are determined jointly to provide for the selection and customization or tuning of the selected BV of the MISHFETs 100, 200, 300. As mentioned above, for a selected BV or range of breakdown voltages, when the second (or upper) dielectric layer 120 comprises a material having a comparatively greater relative permittivity, the thickness of the second (or upper) dielectric layer 120 may be smaller, while when the second (or upper) dielectric layer 120 comprises a material having a comparatively lower relative permittivity, the thickness of the second (or upper) dielectric layer 120 may be greater. For example, a comparatively high dielectric constant k (relative permittivity ($\varepsilon_r$)) may be utilized for the second (or upper) dielectric layer 120, as the higher the k-value, the thinner the second (or upper) dielectric layer 120 can be, in order to achieve the same breakdown voltage that could be obtained using a thicker second (or upper) dielectric layer 120 comprising a material having a lower relative permittivity (lower k-value).

The barrier layer 135, in a representative embodiment, comprises InAlN, such as an $In_xAl_{1-x}N$ barrier layer 135 where x is between 0 and 1. Other materials which also may be utilized for the barrier layer 135, include, for example and without limitation, AlGaN, AlN, and combinations thereof. In a representative embodiment, an $In_{0.17}Al_{0.83}N$ barrier layer 135 is grown or provided to be lattice matched to a GaN buffer layer 145 (i.e., at indium mole-fraction x=0.17, as mentioned above), allowing fewer structural defects than an AlGaN/GaN lattice mismatched heterostructure. The barrier layer 135, depending upon the selected embodiment and use of the MISHFET 100, 200, 300, may be between about 5 and 40 nm thick, and in particular may be about 10 nm thick, for example and without limitation.

In a representative embodiment, the buffer layer 145 and the channel layer 140 are typically a group III-V semiconductor, such as GaN. In a representative embodiment, the buffer layer 145 and the channel layer 140 are typically a group III-V semiconductor selected from the group consisting of III-V semiconductors, which are compounds of at least one trivalent metal (aluminum, gallium, indium, and thallium) with at least one trivalent non-metal (nitrogen, phosphorous, arsenic, and antimony) such as gallium arsenide (GaAs), gallium nitride (GaN), indium phosphide, GaP, InAlGaP, InAlGaP, AlInGaAs, InGaNAs, AlInGASb, and mixtures thereof. In addition, the channel layer 140 may also include AlGaN in which Al is typically just a small percentage, or a thin AlN layer, often referred to as back barrier. The channel layer 140, depending upon the selected embodiment and use of the MISHFET 100, 200, 300, may be between 5 nm and 15 nm thick, and in particular, may be 10 nm thick, for example and without limitation. The buffer layer 145, depending upon the selected embodiment and use of the MISHFET 100, 200, 300, may be between 0.1 to 3 microns thick, and in particular, may be 1.5 microns thick, for example and without limitation. The thickness of the barrier layer 135 left after the recess-etch (for a recessed gate 110) may be less than 5 nm, and in particular may be 1 nm, for example and without limitation. This first (or lower) dielectric layer 125 may suppress the gate 110 leakage current and minimize interface trap states. It will be understood by those with skill in the art that other materials, thicknesses or combinations may be used for the barrier layer 135, the channel layer 140, and the buffer layer 145, and any and all such materials, thicknesses and combinations are within the scope of the disclosure.

Normally-off operation of InAlN/GaN MISHFET is achieved by a gate 110 recess method. In a representative embodiment, the gate 110, the source 105 and the drain 115 typically comprise one or more metal layers and/or ohmic metal layers. The gate 110, the source 105 and the drain 115, for example and without limitation, may be a metal selected from the group consisting of: nickel (Ni), gold (Au), palladium (Pd), titanium (Ti), aluminum (Al), molybdenum (Mo), tantalum (Ta), and combinations thereof. Also in a representative embodiment, the gate 110, the source 105 and the drain 115 comprises a succession of layers Ta/Ti/Al/Mo/Au metal depositions followed by rapid thermal annealing, for example and without limitation. Not separately illustrated in FIGS. 1-3, the gate 110, the source 105 and the drain 115 may have additional metal layers or bonding pads.

A substrate 155 is typically a wafer utilized in IC fabrication, and may comprise, for example and without limitation, a silicon substrate, which may be a silicon wafer or may be a more complex silicon-based substrate or wafer, such as comprising a silicon substrate on insulator ("SOT"), or a gallium nitride (GaN) substrate, a sapphire substrate, a silicon carbide (SiC) substrate, or a diamond substrate, etc., for example and without limitation.

Various layers may also be doped with any suitable compound, such as to provide n, n+, p, and/or p+ doping or to counteract any such n, n+, p, and/or p+ doping. For example, the GaN or AlGaN buffer layer 145 can be carbon or iron doped to counteract the unintentional n-type doping. Also for example, as an option, AlGaN (e.g., having about 5% Al) may also be grown as part of a GaN buffer layer 145 (e.g., as a "back barrier").

It should be noted that there are no restrictions on the gate-to-drain length ($L_{gd}$), gate-to-source length ($L_{gs}$), and gate length ($L_g$), for any of the various MISHFETs 100, 200, 300, with those various lengths and other dimensions generally determined for the selected application (e.g., high or low power) and available fabrication technologies. Typical dimensions, for example and without limitation, for a power switch embodiment, may be a gate-to-drain length ($L_{gd}$) of between about 5 to 15 microns (e.g., about 10 microns), with a longer $L_{gd}$ for higher voltages, a gate-to-source length ($L_{gs}$) of about 1 to 2 microns, and gate length ($L_g$) of about 1 to 2 microns (e.g., about 1 micron). Typical dimensions for many other embodiments may be considerably smaller, such as for a power amplifier, and may be, for example and without limitation, a gate-to-drain length ($L_{gd}$) of between about 0.5 to 5 microns, a gate-to-source length ($L_{gs}$) of about 0.5 to 1 microns, and gate length ($L_g$) of about 15 nm to 0.5 microns.

EXAMPLES

A structure with a top 985 nm $TiO_2$/bottom 15 nm $HfO_2$ passivation stack has been tested, and exhibits a BV of about 750V with a leakage current less than 4 µA/mm. Various simulations of the MISHFET 100 were also performed. For all the simulated structures, a 15 nm $HfO_2$ layer (first (or lower) dielectric layer 125, relative permittivity $\varepsilon_1$) is directly on top of 10 nm lattice-matched In0.17Al0.83N barrier layer 135, under which lies a 10 nm i-GaN channel layer 140 and a 1.5 µm GaN buffer layer 145. The InAlN barrier layer 135 left after the recess etch is 1 nm. This 15 nm $HfO_2$ first (or lower) dielectric layer 125 is mainly to suppress the gate 110 leakage current and minimize interface trap states. Above the first (or lower) dielectric layer 125 (15 nm $HfO_2$), the additional second (or upper) dielectric layer 120 is added, of various thicknesses and compositions (having relative permittivity $\varepsilon_2$) is added. Also for all the simulated structures, the source-to-gate spacing $L_{sg}$ and gate length $L_g$ may be fixed at 1 µm and the gate-to-drain spacing $L_{gd}$ at 10 µm, as illustrated in FIG. 1. The source/drain contact lengths $L_s/L_d$ may be fixed at 7 µm. The numerical simulations were carried out by SILVACO ATLAS. Shockley-Read-Hall, Fermi-Dirac statistics and Auger Recombination models are enabled. The impact ionization model was also enabled and parameters set suitable for the nitride materials. In order to suppress leakage current, shallow acceptor-like traps (energy level=0.36 eV) with density of $7 \times 10^{17}$ cm$^{-3}$ may be introduced in the GaN buffer layer 145 for all the cases. The sheet electron density of the InAlN/GaN device was calculated by ATLAS to be $2.17 \times 10^{13}$ cm$^{-2}$, which agrees well with the 2 DEG density reported from experiment. The simulated threshold voltage $V_{th}$ (with 1 nm InAlN left) is about 0.6V, which agrees well with Eq. (3) for the recessed-gate InAlN/GaN MISHFET.

$$V_{th} = \frac{\Phi_b}{q} - \frac{\Delta E_c}{q} - \frac{\Phi_f}{q} - q\left(\frac{t_{ox}}{\varepsilon_{ox}} + \frac{t_{InAlN}}{\varepsilon_{InAlN}}\right)Q_{InAlN/GaN} \quad (3)$$

In this equation, the metal barrier height for Ni gate on $HfO_2$ $\Phi_b$, conduction band offset between $HfO_2$ and InAlN $\Delta E_c$, conduction band distance from the Fermi-level in intrinsic GaN buffer $\Phi_f$, thickness t, permittivity $\varepsilon$, polarization sheet charge density at InAlN/GaN interface $Q_{InAlN/GaN}$ are all properly set according to the reported values in literature and the specific simulated device structure. If the InAlN barrier layer 135 is completely removed, $V_{th}$ can reach 1.5V, which is very attractive in circuits. The InAlN/GaN device may exhibit a maximum drain current $I_{d,max}$=1.4 A/mm at $V_{gs}$=6V, which is much larger than that from an AlGaN/GaN MISHFET ($I_{d,max}$=0.8 A/mm). This is owing to the higher 2 DEG density induced by larger polarization in the lattice-matched InAlN/GaN MISHFET. Experiments confirmed that the gate bias of 6V would not cause dielectric breakdown in the $HfO_2$ first (or lower) dielectric layer 125 and gate 110 leakage in $HfO_2$-based MIS-structures by using ALD $HfO_2$.

Three-terminal off-state breakdown simulations for normally-off InAlN/GaN MISHFET and normally-off AlGaN/GaN MISHFET without the second (or upper) dielectric layer 120 (still with a 15 nm $HfO_2$ first (or lower) dielectric layer 125 in both devices) were performed (not shown). The AlGaN/GaN device can sustain a BV up to 600V, while the InAlN/GaN device with the same gate-drain spacing only shows a BV of <50V, if the leakage current at breakdown is defined on the μA/mm level. The high drain leakage current in InAlN/GaN devices have also been reported previously. One major cause may be the high electric field peak located at the drain-side gate edge, which might induce high leakage current even under a small drain bias. Due to larger polarization in InAlN/GaN, the electric field peak is much higher than in AlGaN/GaN.

Figure 4:
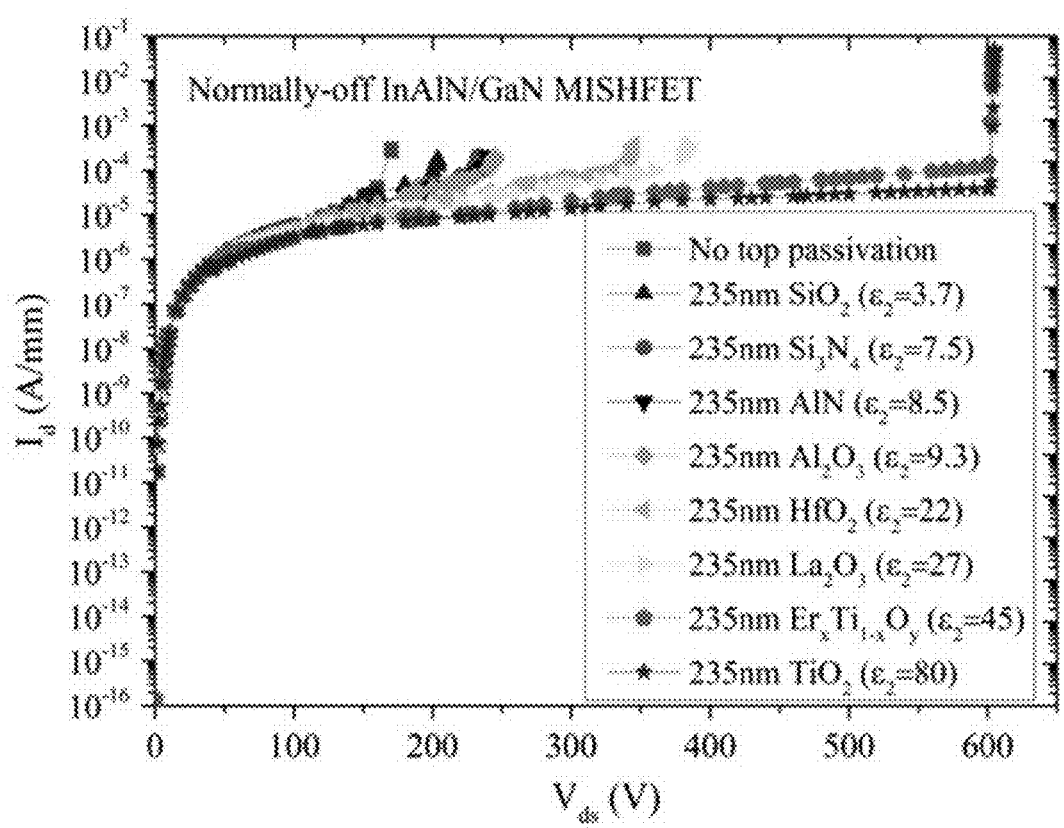
FIG. 4 is a graphical diagram illustrating simulated voltage and current breakdown characteristics of a normally-off InAlN/GaN MISHFET with different materials utilized in a second (or upper) dielectric layer.

FIG. 4 is a graphical diagram illustrating simulated voltage and current breakdown characteristics of a normally-off InAlN/GaN MISHFET 100 with different materials utilized in a second (or upper) dielectric layer 120, namely, using $SiO_2$, $Si_3N_4$, AN, $Al_2O_3$, $HfO_2$, $La_2O_3$, $Er_xTi_{1-x}O_y$, and $TiO_2$ as the second (or upper) dielectric layer 120, each having a thickness ($t_P$) initially fixed at 235 nm, and with a first (or lower) dielectric layer 125 comprising $HfO_2$ having a first thickness of 15 nm. It can be seen that from $SiO_2$ ($\varepsilon_2$=3.7) to $Er_xTi_{1-x}O_y$ ($\varepsilon_2$=45), higher permittivity values are associated with higher BVs. Compared to the structure without any second (or upper) dielectric layer 120 (but still having the 15 nm $HfO_2$ first (or lower) dielectric layer 125), the InAlN/GaN MISHFET with 235 nm $Er_xTi_{1-x}O_y$ ($\varepsilon_2$=45) for the second (or upper) dielectric layer 120 improves the BV from less than 50V to over 600V. However, when the permittivity of the second (or upper) dielectric layer 120 goes higher than 45, the BV value does not increase, while the leakage current is reduced slightly, for this representative simulation.

Figure 5A:
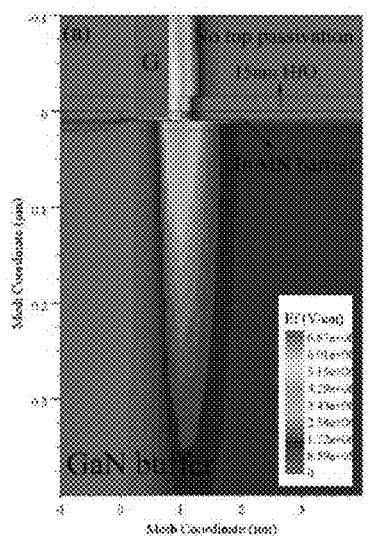
FIGS. 5A, 5B and 5C (collectively referred to as FIG. 5) are diagrams illustrating electric field distribution at the gate edge of a normally-off InAlN/GaN MISHFET, without a second (or upper) dielectric layer in FIG. 5A, with a 235 nm HfO$_2$ second (or upper) dielectric layer in FIG. 5B, with a 235 nm TiO$_2$ second (or upper) dielectric layer in FIG. 5C, and all with a 15 nm HfO$_2$ first (or lower) dielectric layer.
Figure 5B:
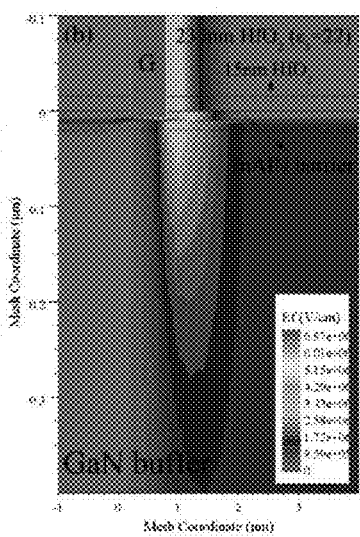
Figure 5C:
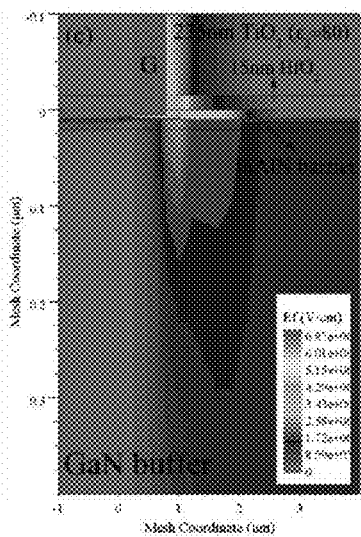

FIGS. 5A, 5B and 5C (collectively referred to as FIG. 5) are diagrams illustrating electric field distribution at the gate edge of a normally-off InAlN/GaN MISHFET 100, without a second (or upper) dielectric layer 120 in FIG. 5A, with a 235 nm $HfO_2$ second (or upper) dielectric layer 120 in FIG. 5B, with a 235 nm $TiO_2$ second (or upper) dielectric layer 120 in FIG. 5C, and all with a 15 nm $HfO_2$ first (or lower) dielectric layer 125, along with a gate 110 bias at 0 V and a drain 115 bias at 160 V. In all cases, the gate 110 bias and drain 115 bias are set at 0V and 160V, respectively. It can be seen that for the device without any second (or upper) dielectric layer 120, the peak electric field is located at the drain-side gate edge when breakdown happens, as expected. The additional second (or upper) dielectric layer 120 effectively alleviates the peak electric field at the gate 110 edge and leads to a much smoother field distribution in the channel. Furthermore, a more even electric field distribution in the channel is obtained in the device with a comparatively higher-permittivity second (or upper) dielectric layer 120, compared to that with a lower permittivity. Thus, avalanche multiplication effect at high $V_{ds}$ can be suppressed to a greater extent, and pronounced improvement of the breakdown voltage can be achieved by using a comparatively high-k second (or upper) dielectric layer 120.

Figure 6:
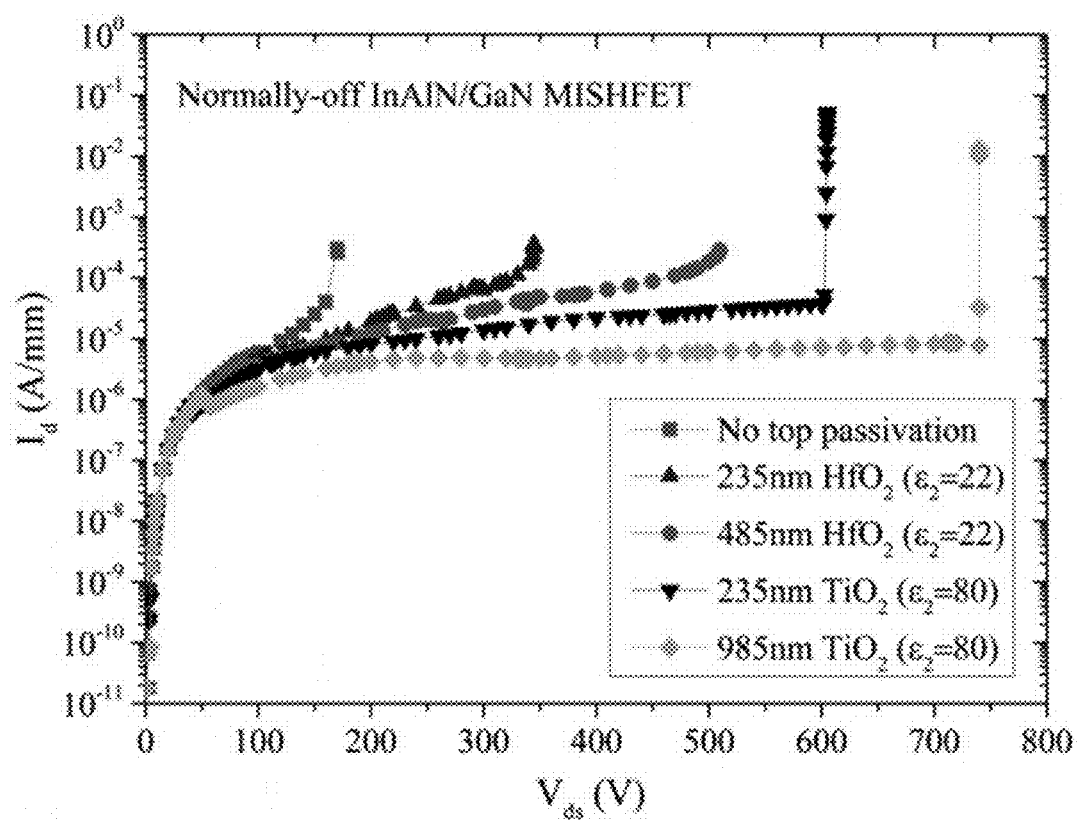
FIG. 6 is a graphical diagram illustrating simulated voltage and current breakdown characteristics of a normally-off InAlN/GaN MISHFET with different thicknesses of selected materials utilized in a second (or upper) dielectric layer.
Figure 7A:
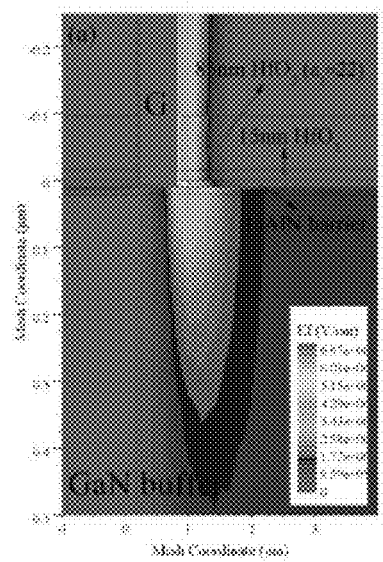
FIGS. 7A, 7B and 7C (collectively referred to as FIG. 7) are diagrams illustrating electric field distribution at the gate edge of a normally-off InAlN/GaN MISHFET, with a 85 nm HfO$_2$ second (or upper) dielectric layer in FIG. 7A, with a 235 nm HfO$_2$ second (or upper) dielectric layer in FIG. 7B, with a 485 nm HfO$_2$ second (or upper) dielectric layer in FIG. 7C, and all with a 15 nm HfO$_2$ first (or lower) dielectric layer.
Figure 7B:
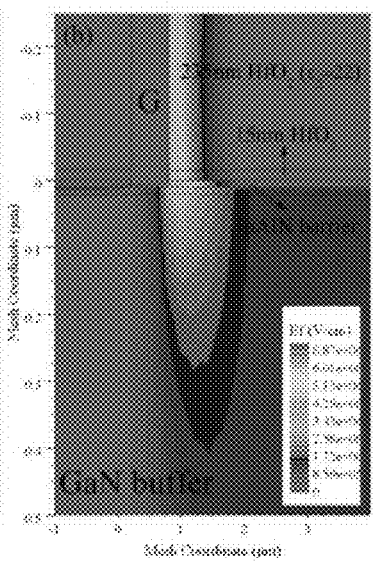
Figure 7C:
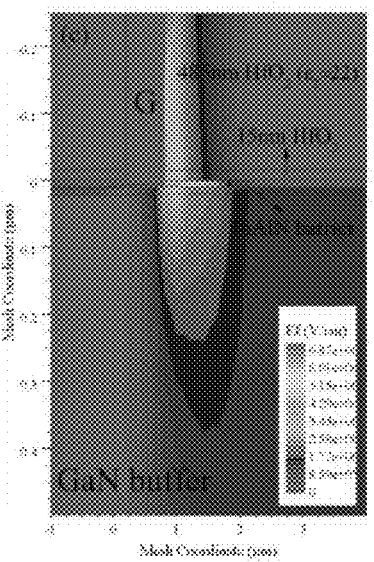

FIG. 6 is a graphical diagram illustrating simulated voltage and current breakdown characteristics of a normally-off InAlN/GaN MISHFET with different thicknesses of selected materials utilized in a second (or upper) dielectric layer. FIGS. 7A, 7B and 7C (collectively referred to as FIG. 7) are diagrams illustrating electric field distribution at the gate edge of a normally-off InAlN/GaN MISHFET, with a 85 nm $HfO_2$ second (or upper) dielectric layer 120 in FIG. 7A, with a 235 nm $HfO_2$ second (or upper) dielectric layer 120 in FIG. 7B, with a 485 nm $HfO_2$ second (or upper) dielectric layer 120 in FIG. 7C, and all with a 15 nm $HfO_2$ first (or lower) dielectric layer 125, and gate 110 bias at 0 V and a drain 115 bias at 160 V. As mentioned above, the thickness ($t_P$) of the second (or upper) dielectric layer 120 can also affect the BV. Breakdown simulations were performed on normally-off InAlN/GaN MISHFETs 100 with 235 nm and 485 nm $HfO_2$ ($\varepsilon_r$=22) second (or upper) dielectric layers 120, and with 235 nm and 985 nm $TiO_2$ ($\varepsilon_r$=80) second (or upper) dielectric layers 120, illustrated in FIG. 6. The 15 nm $HfO_2$ first (or lower) dielectric layer 125 (gate 110 insulator) is provided in all devices. As tested, the $HfO_2$ first (or lower) dielectric layer 125 was 15 nm thick, but a thicker or thinner layer could be used. The breakdown characteristics of different thicknesses of second (or upper) dielectric layers 120 are shown in FIG. 6. An improvement of BV from 325V to 460V is observed after the thickness of $HfO_2$ second (or upper) dielectric layer 120 increases from 235 nm to 485 nm; and the BV increases from 602V to 750V as the $TiO_2$ second (or upper) dielectric layer 120 increases from 235 nm to 985 nm. Thus the BV is not only affected by the permittivity of the material selected for the second (or upper) dielectric layer 120 but also by the thickness of the second (or upper) dielectric layer 120, as mentioned above. As the second (or upper) dielectric layer 120 becomes thicker, the peak electric field at the drain-side gate edge is reduced further (shown in FIG. 7). This leads to a more evenly distributed field along the channel, and it shows a similar effect as from a field plate and hence increased BV but without the degradation in frequency response from a field plate.

FIGS. 8A and 8B (collectively referred to as FIG. 8) are graphical diagrams illustrating voltage and current breakdown characteristics (FIG. 8A) and off-state electric field distribution (FIG. 8B) of a normally-off InAlN/GaN MISHFET 100 with second (or upper) dielectric layers 120 having similar permittivity-thickness product values but comprising different materials and thicknesses, namely, 250 nm $SiO_2$ ($\varepsilon_r$=3.7), 122 nm $Si_3N_4$ ($\varepsilon_r$=7.5), 99 nm $Al_2O_3$ ($\varepsilon_r$=9.3), and 42 nm $HfO_2$ ($\varepsilon_r$=22), and all with a first (or lower) dielectric layer 125 comprising $HfO_2$ having a first thickness of 15 nm, and in FIG. 8B, a gate 110 bias at 0 V and a drain 115 bias at 190 V. The BV of an InAlN/GaN MISHFET 100 strongly depends on both the permittivity and thickness of the second (or upper) dielectric layer 120. Thicker second (or upper) dielectric layers 120 and higher permittivities can efficiently reduce the peak electric field at the gate 110 edge, leading to a smoother field distribution in the InAlN/GaN channel.

In order to study the relationship among the permittivity ($\varepsilon_r$) of the second (or upper) dielectric layer 120, the passivation thickness ($t_p$) of the second (or upper) dielectric layer 120, and the BV of the MISHFET 100, a set of InAlN/GaN MISHFETs 100 with second (or upper) dielectric layers 120 of almost the same value of the permittivity-thickness parameter ($\varepsilon_{r2} \cdot t_{P2}$) have been simulated for breakdown characteristics. Both the $HfO_2$ first (or lower) dielectric layer 125 and the second (or upper) dielectric layer 120 have been included. As tested, the $HfO_2$ first (or lower) dielectric layer 125 was 15 nm thick, but other thicknesses and other materials as disclosed above could be used. For the same value of the permittivity-thickness parameter ($\varepsilon_{r2} \cdot t_{P2}$), the BV and leakage of the InAlN/GaN MISHFETs 100 with different passivation schemes for the second (or upper) dielectric layer 120 are almost the same, and their off-state electric field distributions are also nearly the same (shown in FIG. 8). As the permittivity-thickness parameter (product of relative permittivity and thickness) increases for the second (or upper) dielectric layer 120, the second (or upper) dielectric layer 120 has a stronger influence on electric field distribution in the channel, and the peak field at the gate 110 edge can be more efficiently alleviated, leading to increased BV and reduced drain leakage current, as mentioned above.

Figure 9:
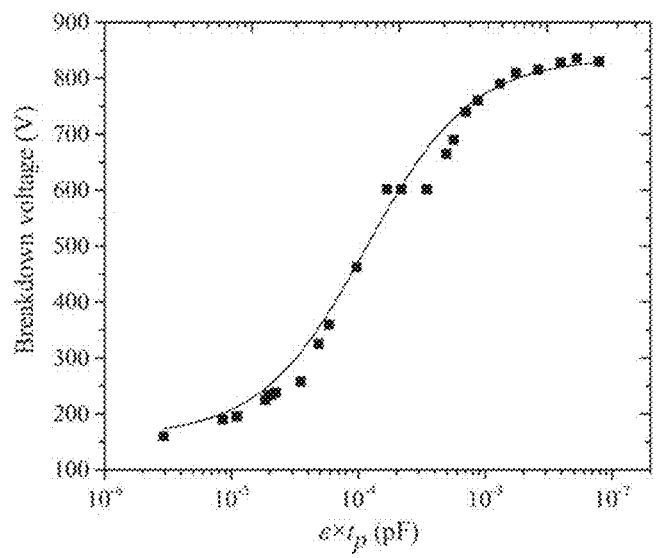
FIG. 9 is a graphical diagram illustrating voltage and current breakdown characteristics of a normally-off InAlN/GaN MISHFET with second (or upper) dielectric layers having different permittivity-thickness parameter values.
Figure 10:
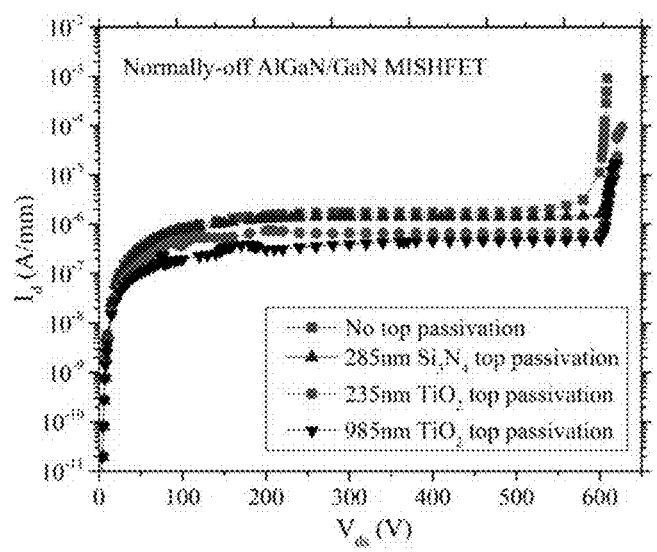
FIG. 10 is a graphical diagram illustrating simulated voltage and current breakdown characteristics of a normally-off AlGaN/GaN MISHFET with different thicknesses of selected materials utilized in a second (or upper) dielectric layer.
Figure 11A:
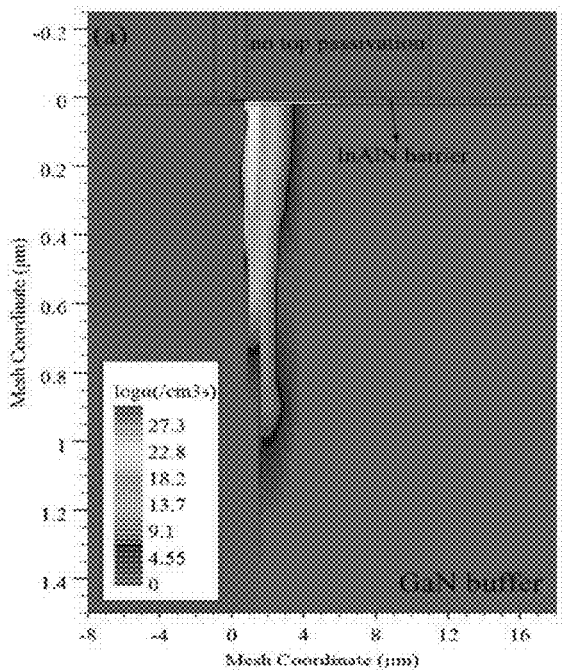
FIGS. 11A and 11B (collectively referred to as FIG. 11) are diagrams illustrating simulated impact ionization rates of a normally-off InAlN/GaN MISHFET without a second (or upper) dielectric layer (in FIG. 11A) and with 985 nm TiO$_2$ second (or upper) dielectric layer (in FIG. 11B).
Figure 11B:
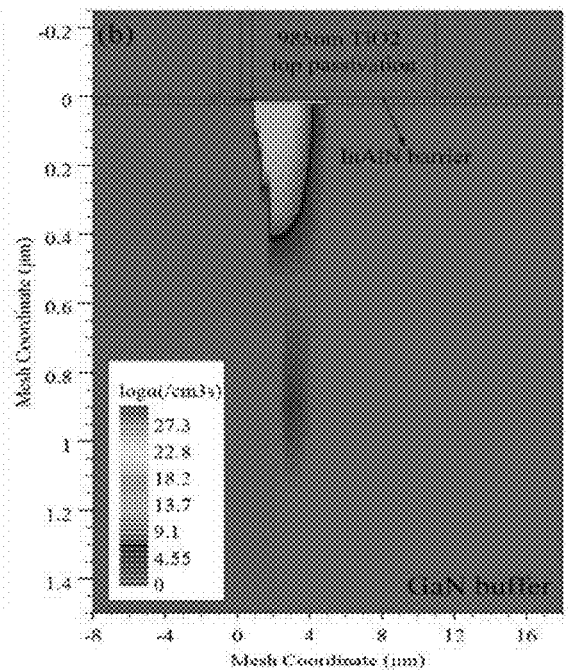
Figure 12A:
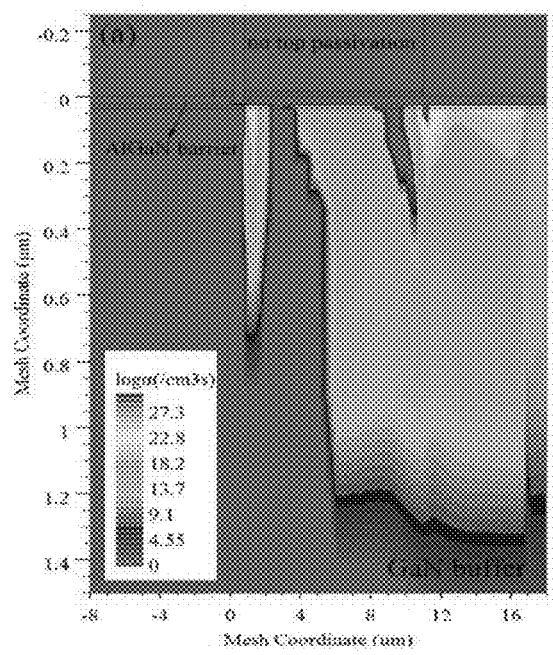
FIGS. 12A and 12B (collectively referred to as FIG. 12) are diagrams illustrating simulated impact ionization rates of a normally-off AlGaN/GaN MISHFET without a second (or upper) dielectric layer (in FIG. 12A) and with 985 nm TiO$_2$ second (or upper) dielectric layer (in FIG. 12B).
Figure 12B:
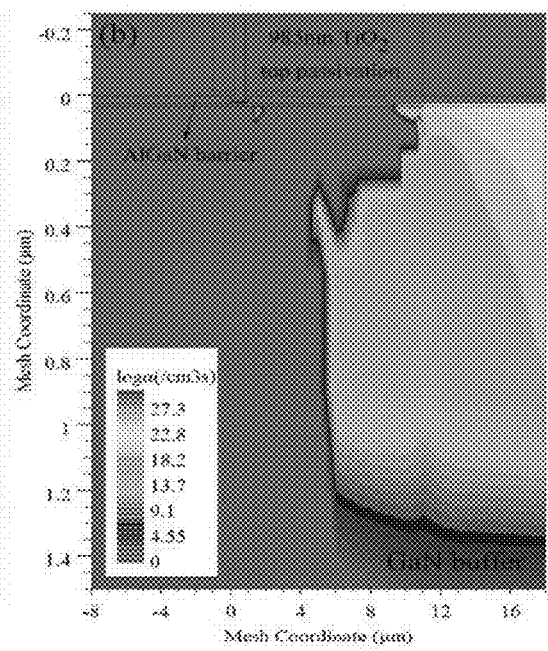

FIG. 9 is a graphical diagram illustrating voltage and current breakdown characteristics of a normally-off InAlN/GaN MISHFET 100 with second (or upper) dielectric layers 120 having different permittivity-thickness parameter values. FIG. 9 also provides an example of using permittivity rather than relative permittivity in the permittivity-thickness parameter, as an example of an equivalent variation. FIG. 10 is a graphical diagram illustrating simulated voltage and current breakdown characteristics of a normally-off AlGaN/GaN MISHFET 100 with no second (or upper) dielectric layers 120 and with different thicknesses of selected materials utilized in a second (or upper) dielectric layer 120, namely, 285 nm $Si_3N_4$ ($\varepsilon_r$=7.5), 235 nm $TiO_2$, and 985 nm $TiO_2$, and all with a first (or lower) dielectric layer 125 comprising $HfO_2$ having a first thickness of 15 nm. FIGS. 11A and 11B (collectively referred to as FIG. 11) are diagrams illustrating simulated impact ionization rates of a normally-off InAlN/GaN MISHFET without a second (or upper) dielectric layer 120 (FIG. 11A) and with 985 nm $TiO_2$ second (or upper) dielectric layer 120 (FIG. 11B), all with a first (or lower) dielectric layer 125 comprising $HfO_2$ having a first thickness of 15 nm, and a gate 110 bias at 0 V and a drain 115 bias at 160 V. FIGS. 12A and 12B (collectively referred to as FIG. 12) are diagrams illustrating simulated impact ionization rates of a normally-off AlGaN/GaN MISHFET without a second (or upper) dielectric layer 120 (FIG. 12A) and with 985 nm $TiO_2$ second (or upper) dielectric layer 120 (FIG. 12B), all with a first (or lower) dielectric layer 125 comprising $HfO_2$ having a first thickness of 15 nm, and a gate 110 bias at 0 V and a drain 115 bias at 600 V.

Referring to FIGS. 9-12, it can be seen that as the permittivity-thickness parameter increases from $2.92 \times 10^{-6}$ pF (with no second (or upper) dielectric layer 120) to $9.65 \times 10^{-5}$ pF (235 nm $Er_xTi_{1-x}O_y$ second (or upper) dielectric layer 120), the BV increases from 50V to over 600V. As the permittivity-thickness parameter further increases up to $7.93 \times 10^{-3}$ pF, the BV is further improved to 830V. It should be noted that in a normally-off AlGaN/GaN MISHFET 100, no obvious improvement in BV with the increase of permittivity-thickness parameter ($\varepsilon_{r2} \cdot t_{P2}$) is shown, but the leakage current is reduced by one order of magnitude (shown in FIG. 10). As the electric field induced at the drain-side gate edge in an InAlN/GaN device is much higher than in AlGaN/GaN due to the increase in polarization charges, premature breakdown due to impact ionization caused by this high electric field might be one of the main causes for the much lower BV in an InAlN/GaN device. FIG. 11 shows the impact ionization rates in the InAlN/GaN device before and after the optimized passivation scheme under the same bias conditions. It is seen that the impact ionization rate is reduced significantly with the addition of the second (or upper) dielectric layer 120. FIG. 12 shows the impact ionization rates in the AlGaN/GaN device before and after the same passivation scheme using a second (or upper) dielectric layer 120. Even though the impact ionization at the drain-side gate edge is mostly suppressed with passivation, there is still significant ionization happening at the drain-end of the channel, which may explain the unimproved BV after the passivation. Even though the additional passivation provided by the second (or upper) dielectric layer 120 does not increase BV in an AlGaN/GaN MISHFET much, it still reduces the leakage current slightly.

Figure 13:
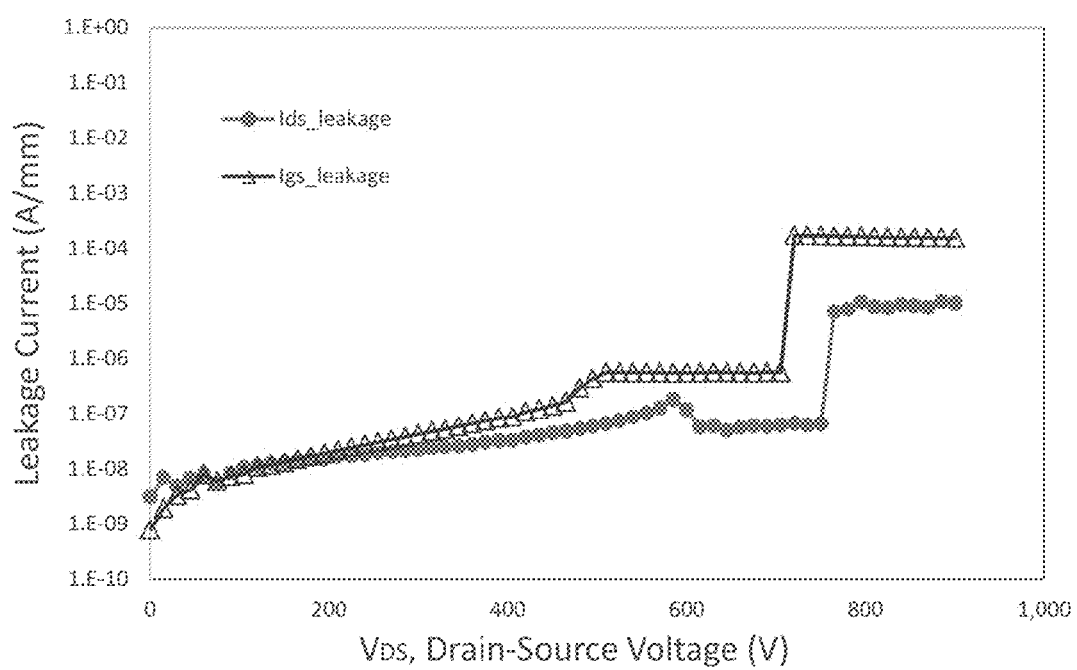
FIG. 13 is a graphical diagram illustrating measured leakage currents for a given drain-to-source voltage of a normally-off InAlN/GaN MISHFET with a second (or upper) dielectric layer having a selected permittivity-thickness product value.

FIG. 13 is a graphical diagram illustrating measured leakage currents for a given drain-to-source voltage of a normally-off InAlN/GaN MISHFET 100 with a second (or upper) dielectric layer 120 having a selected permittivity-thickness product value. MISHFETs 100 were fabricated on InAlN/GaN substrates, with a double dielectric scheme ($HfO_2$ for the first (or lower) dielectric layer 125 together with a comparatively high-k material, TiO2 in this example, for the second (or upper) dielectric layer 120), and the breakdown voltages reached over 700V as predicted. Ohmic resistance was 0.6 Ohm-mm with an Ohmic recess etch combined with Ta/Ti/Al/Mo/Au metal deposition and rapid thermal annealing. A MISHFET 100 having a first dielectric layer 125 of 15 nm $HfO_2$ and a second dielectric layer 120 with a thickness of about 450 nm and comprising $TiO_2$, as a passivation stack, increased the breakdown voltage to over 750V, with leakage current on the level of μA/mm, as measured.

Figure 14:
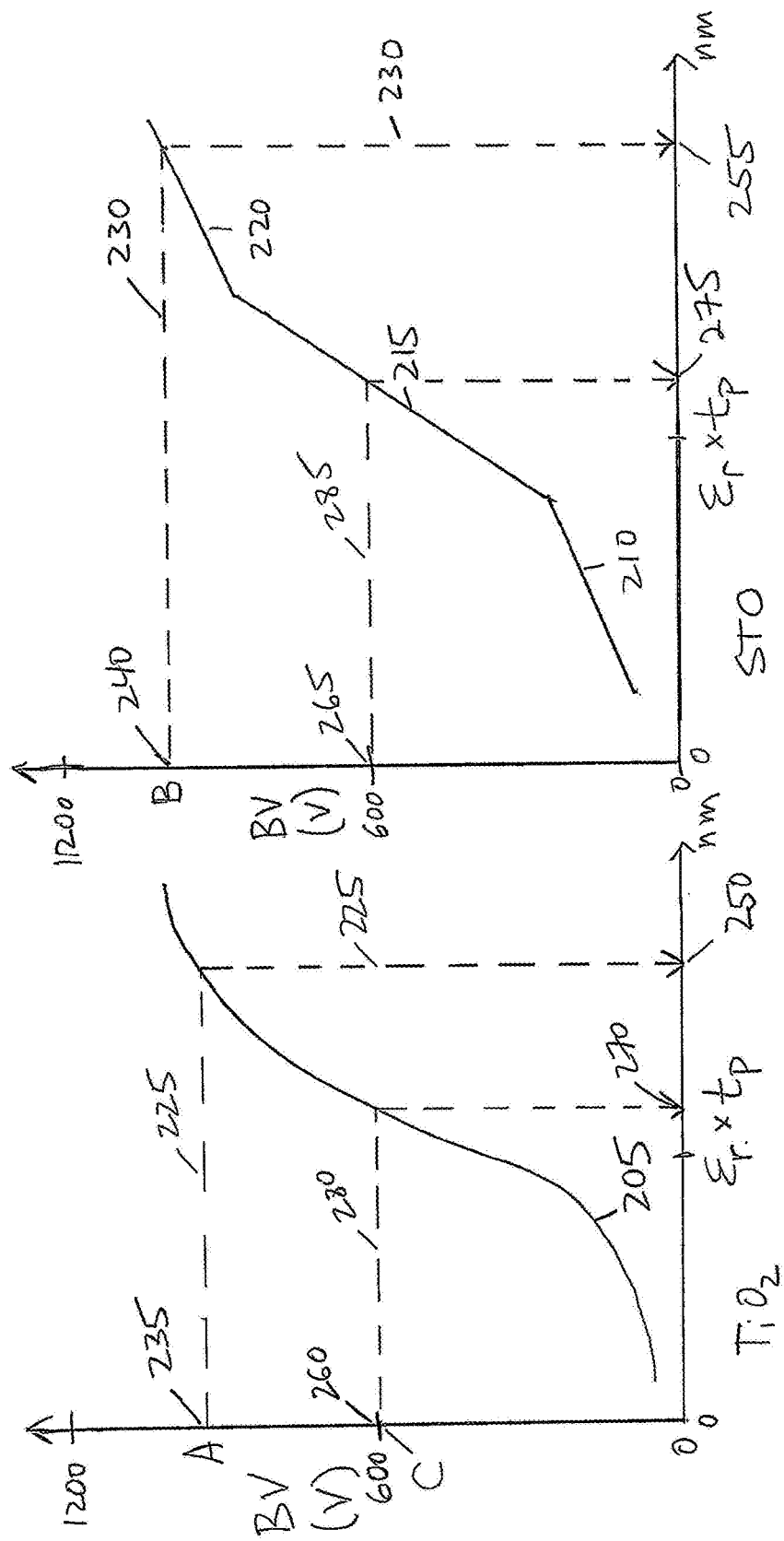
FIGS. 14A and 14B (collectively referred to as FIG. 14) are graphical diagrams illustrating mapping of a selected breakdown voltage (and current) of a normally-off InAlN/GaN MISHFET to a permittivity-thickness product value for a selected dielectric material (TiO$_2$ in FIG. 14A and SrTiO$_2$ ("STO") in FIG. 14B) for a second (or upper) dielectric layer for breakdown voltage customization during fabrication of a normally-off InAlN/GaN MISHFET.
Figure 15:
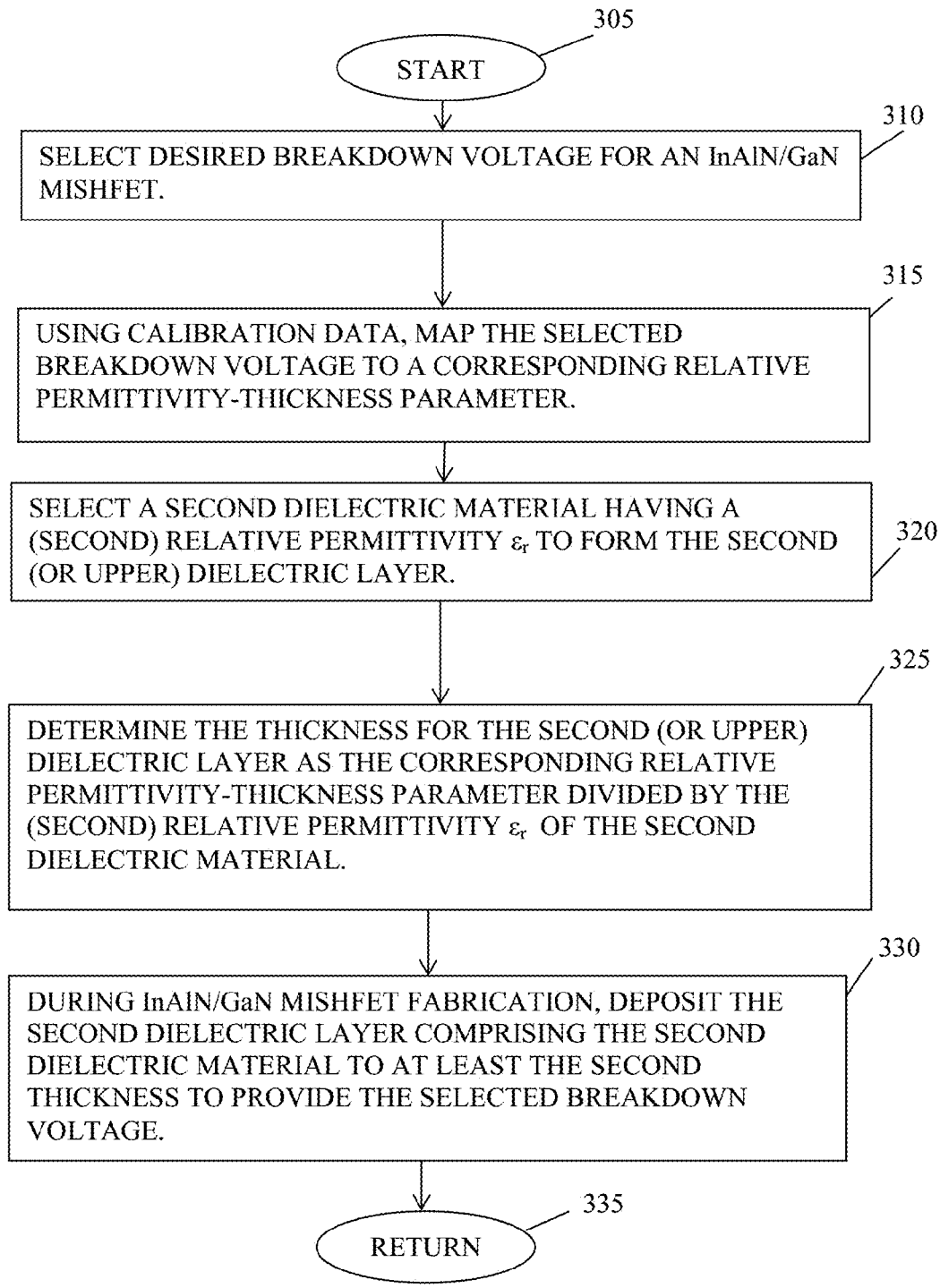
FIG. 15 is a flow diagram illustrating a method of selecting or customization of the voltage and current breakdown characteristics of a normally-off InAlN/GaN MISHFET.

FIGS. 14A and 14B are graphical diagrams illustrating mapping of a selected breakdown voltage (and current) of a normally-off InAlN/GaN MISHFET 100, 200, 300 to a permittivity-thickness product value for a selected dielectric material for a second (or upper) dielectric layer 120 for breakdown voltage customization during fabrication of a MISHFET 100, 200, 300, such as for $TiO_2$ in FIG. 14A and STO in FIG. 14B. FIG. 15 is a flow diagram illustrating a method of selecting or customization of the voltage and current breakdown characteristics of a normally-off InAlN/GaN MISHFET 100, 200, 300. While FIGS. 14A, 14B and 15 are illustrated and discussed with reference to normally-off InAlN/GaN, those having skill in the art will recognize that this mapping and methodology pertain to any MISHFET 100, 200, 300 and any and all are within the scope of the disclosure.

Referring again to FIGS. 9, 14 and 15, it can be seen that as the permittivity-thickness parameter increases, the BV of the MISHFET 100, 200, 300 also increases. This relationship may be linear or nonlinear, and a sigmoidal relationship is illustrated in FIGS. 9 and 14A (calibration line 205), and illustrated as a piece-wise linear relationship (calibration lines 210, 215, and 220) in FIG. 14B. Any number of such calibration relationships between BV and the permittivity-thickness parameter may be developed for any selected material comprising the second (or upper) dielectric layer 120, such as through a testing (measurement) process or through a modeling or simulation process, to create corresponding calibrations of BV with the permittivity-thickness parameters ($\varepsilon_{r2} \cdot t_{P2}$), with FIGS. 14A and 14B illustrating two such calibration curves as examples. For example, for a second (or upper) dielectric layer 120 having a selected material such as $TiO_2$, a plurality of MISHFETs 100, 200, or 300 may be fabricated, each having a different thickness of this second (or upper) dielectric layer 120, followed by testing and measurement of leakage current levels at different applied drain-to-source voltage ($V_{ds}$) levels, as illustrated in FIG. 9, for example and without limitation. In addition to direct empirical measurements, such calibration data may also be provided through appropriate modeling and simulation, also for example and without limitation. Such calibration data may also be provided numerically, in addition to graphically, such as using a tabular format, for example and without limitation.

As illustrated in FIGS. 14A and 14B, this testing and measurement information can be used to provide a calibration between a selected BV and a corresponding permittivity-thickness parameter, with a given permittivity-thickness parameter ($\varepsilon_r \cdot t_{P2}$) providing a corresponding BV in a MISHFET 100, 200, 300. As result, a selected BV for a MISHFET 100, 200, 300 is then mapped directly to a corresponding permittivity-thickness parameter. As illustrated in FIG. 14A, a selected BV "A" (235, e.g., 900V) is mapped (line 225) directly to a corresponding permittivity-thickness parameter (250), and as illustrated in FIG. 14B, a selected BV "B" (240, e.g., 950V) is mapped (line 230) directly to a corresponding permittivity-thickness parameter (255). Once a material is selected having a specific relative permittivity $\varepsilon_r$ to form the second (or upper) dielectric layer 120, the thickness of the second (or upper) dielectric layer 120 is then known (with the thickness $t_p=(\varepsilon_r \cdot t_p)/\varepsilon_r$), to provide a MISHFET 100, 200, 300 having the selected breakdown voltage.

Also as illustrated in FIG. 14A, a selected BV "C" (260, e.g., 600V) is mapped (line 280) directly to a corresponding permittivity-thickness parameter (270), and as illustrated in FIG. 14B, a selected BV "D" (265, e.g., 600V) is mapped (line 285) directly to a corresponding permittivity-thickness parameter (275). Using this mapping of FIG. 14A, if $TiO_2$ is selected as the material for the second (or upper) dielectric layer 120, the second (or upper) dielectric layer 120 should then have a thickness $t_p$ of at least about 235 nm to achieve a 600V breakdown voltage for a MISHFET 100, 200, 300. In comparison, using this mapping of FIG. 14B, if STO is selected as the material for the second (or upper) dielectric layer 120, the second (or upper) dielectric layer 120 should then have a thickness $t_p$ of only at least about 65 nm to achieve the same 600V breakdown voltage for a MISHFET 100, 200, 300.

This method of selecting or customizing the BV of the MISHFET 100, 200, 300 is also illustrated in FIG. 15, which provides a useful summary. Beginning with start step 305, a desired breakdown voltage is selected for the MISHFET 100, 200, 300, step 310. Using calibration data, the selected BV is then mapped to a corresponding permittivity-thickness parameter, step 315. A second dielectric material is selected having a second relative permittivity $\varepsilon_r$ to form the second (or upper) dielectric layer 120, step 320. The thickness for the second (or upper) dielectric layer 120 is then determined, step 325, as the corresponding permittivity-thickness parameter divided by the (second) relative permittivity $\varepsilon_r$ of the second dielectric material selected to form the second (or upper) dielectric layer 120. During InAlN/GaN MISHFET 100, 200, 300 fabrication, the second dielectric layer 120 comprising the second dielectric material is deposited to at least the second thickness to provide the selected breakdown voltage, step 330. It should be noted that step 330 may occur at a different time, typically at a later time in a fabrication stage, with steps 310-325 occurring earlier in a MISHFET 100, 200, 300 design and engineering stage. Following deposition of the second (or upper) dielectric layer 120, the method may end, return step 335, and other fabrication steps may occur (e.g., metal deposition, deposition of a third dielectric or passivation layer 130) to complete a MISHFET 100, 200, 300 with a second (or upper) dielectric layer 120 having this determined thickness and selected composition to provide the selected breakdown voltage.

As mentioned above, a second (or upper) dielectric layer 120 may also be comprised of a plurality of sublayers, collectively forming the second (or upper) dielectric layer 120. Such sublayers may or may not be comprised of the same material, and may be different materials with different relative permittivities. Those having skill in the art will recognize that the various calibrations and methodology of selecting or customizing the BV of the MISHFET 100, 200, 300 may be directly extended to determine the thicknesses of such sublayers of the second (or upper) dielectric layer 120, as a linear combination of the permittivity-thickness parameters of each such sublayer. For example and without limitation, using Equation 2, the overall permittivity-thickness parameter ($\varepsilon_r \cdot t_p$) of the second (or upper) dielectric layer 120 comprised of two sublayers "A" and "B" may be determined as: $(\varepsilon_r \cdot t_p)=(\varepsilon_{rA} \cdot t_{PA})+(\varepsilon_{rB} \cdot t_{PB})$, and so on. Any and all such variations and combinations are within the scope of the disclosure.

The effects of thickness and permittivity of the second (or upper) dielectric layer 120 on the BV and drain leakage current of normally-off InAlN/GaN MISHFETs have been analyzed via numerical simulations and direct testing, as described above. For an InAlN/GaN MISHFET without any second (or upper) dielectric layer 120, the BV is only <50V, which is much lower than its counterpart AlGaN/GaN MISHFET with a similar structure (~600V).

Numerous advantages of the representative embodiments of a MISHFET 100, 200, 300 are readily apparent. In accordance with the representative embodiments, the permittivity-thickness parameter ($\varepsilon \times t_p$) of the second (or upper) dielectric layer 120 is directly utilized to select and customize the BV and drain leakage in representative MISHFETs 100, 200, 300. A much smoother distribution of the electric field in the channel has been observed in InAlN/GaN MISHFETs 100, 200, 300 with higher value of the permittivity-thickness parameter. Therefore, avalanche multiplication effect at high $V_{ds}$ can be efficiently suppressed to a great extent, and pronounced improvement of the breakdown voltage can be achieved. Compared to an InAlN/GaN MISHFET without any second (or upper) dielectric layer 120, the BV of a MISHFET 100, 200, 300 having the second (or upper) dielectric layer 120 comprising $TiO_2$ with a thickness of 450 nm, along with using 15 nm $HfO_2$ for the first dielectric layer 125, as a passivation stack, increases the breakdown voltage from less than 50V to over 750V, with leakage current on the level of μA/mm.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. One having skill in the art will further recognize that additional or equivalent method steps may be utilized, or may be combined with other steps, or may be performed in different orders, any and all of which are within the scope of the claimed invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

With respect to signals, we refer herein to parameters that "represent" a given metric or are "representative" of a given metric, where a metric is a measure of a state of at least part of the regulator or its inputs or outputs. A parameter is considered to represent a metric if it is related to the metric directly enough that regulating the parameter will satisfactorily regulate the metric. A parameter may be considered to be an acceptable representation of a metric if it represents a multiple or fraction of the metric.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated. In addition, every intervening sub-range within range is contemplated, in any combination, and is within the scope of the disclosure. For example, for the range of 5-10, the sub-ranges 5-6, 5-7, 5-8, 5-9, 6-7, 6-8, 6-9, 6-10, 7-8, 7-9, 7-10, 8-9, 8-10, and 9-10 are contemplated and within the scope of the disclosed range.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A normally-off InAlN/GaN metal-insulator-semiconductor heterostructure field-effect transistor ("MISHFET") having a predetermined breakdown voltage selectable before or during transistor fabrication, comprising:
   a substrate;
   a GaN buffer layer coupled to the substrate, the GaN buffer layer further comprising a channel;
   an InAlN barrier layer coupled to the GaN buffer layer;
   a first dielectric layer coupled to the InAlN barrier layer, the first dielectric layer comprising a first dielectric material having a first predetermined thickness and a first relative permittivity;
   a gate coupled in direct contact with the first dielectric layer and disposed in a recess in the InAlN barrier layer, the gate having a first side and a second side opposite the first side;
   a source coupled to the InAlN barrier layer and spaced apart from the first side of the gate;
   a drain coupled to the InAlN barrier layer and spaced apart from the second side of the gate; and
   a second dielectric layer coupled in direct contact with the first dielectric layer, with the gate, with the source and with the drain, the second dielectric layer comprising a second dielectric material having a second predetermined thickness and a second relative permittivity, the second relative permittivity greater than or equal to twenty (20).

2. The InAlN/GaN MISHFET of claim 1, wherein the predetermined breakdown voltage is calibrated to and corresponds with a permittivity-thickness parameter selected before or during fabrication of the InAlN/GaN MISHFET, the permittivity-thickness parameter comprising a multiplicative product of the second relative permittivity multiplied by the second predetermined thickness.

3. The InAlN/GaN MISHFET of claim 2, wherein the predetermined breakdown voltage is increased before or during fabrication of the InAlN/GaN MISHFET by selecting a second dielectric material having an increased second relative permittivity, or an increased second predetermined thickness, or both an increased second relative permittivity and an increased second predetermined thickness.

4. The InAlN/GaN MISHFET of claim 1, wherein the second dielectric material and the second predetermined thickness are each selectable variables to jointly determine the predetermined breakdown voltage.

5. The InAlN/GaN MISHFET of claim 1, wherein the first predetermined thickness is between 10 nm and 20 nm and the second predetermined thickness is between 100 nm and 2000 nm.

6. The InAlN/GaN MISHFET of claim 1, wherein the second dielectric material has a second relative permittivity between 30 and 350.

7. The InAlN/GaN MISHFET of claim 1, wherein the second dielectric layer comprises $TiO_2$, the second predetermined thickness is greater than 400 nm, and the predetermined breakdown voltage is greater than 750V.

8. The InAlN/GaN MISHFET of claim 1, wherein the second dielectric layer comprises $Er_xTi_{1-x}O_y$, the second predetermined thickness is greater than 200 nm, and the predetermined breakdown voltage is greater than 600V.

9. The InAlN/GaN MISHFET of claim 1, wherein the first dielectric layer comprises a first dielectric material selected from the group consisting of: $HfO_2$, $Al_2O_3$, $Si_3N_4$, $HfAlO_x$, $HfSiO_x$, and combinations thereof.

10. The InAlN/GaN MISHFET of claim 1, wherein the second dielectric layer comprises a second dielectric material selected from the group consisting of: $HfO_2$, $HfAlO_x$, $HfSiO_x$, $SrTiO_2$ (STO), $HfTiO_2$, $HfYO_x$, $Er_2O_3$, $Y_2O_3$, $TiO_2$, $ErTiO_x$, $Er_xTi_{1-x}O_y$; $AlTiO_x$, $SrTiO_3$, tantalum oxide, zirconium oxide, barium strontium titanate, barium strontium oxide, strontium oxide, and combinations thereof.

11. The InAlN/GaN MISHFET of claim 1, further comprising:
a third dielectric layer coupled to the second dielectric layer, the third dielectric layer having a third relative permittivity less than twenty (20).

12. The InAlN/GaN MISHFET of claim 11, wherein the third dielectric layer comprises a dielectric material selected from the group consisting of: $Si_3N_4$, $SiO_2$, AlN, $Al_2O_3$, and combinations thereof.

13. A method of fabricating the InAlN/GaN MISHFET of claim 1 to have a selectable, predetermined breakdown voltage, comprising:
selecting the predetermined breakdown voltage;
using calibration data, mapping the selected predetermined breakdown voltage to a corresponding permittivity-thickness parameter of a plurality of permittivity-thickness parameters;
selecting a second dielectric material to form the second dielectric layer, the selected material having the second relative permittivity;
determining the second thickness of the second dielectric layer as a quotient of the corresponding permittivity-thickness parameter divided by the second relative permittivity of the selected second dielectric material; and
during transistor fabrication, depositing the second dielectric layer comprising the second dielectric material to at least the second thickness.

14. A normally-off InAlN/GaN metal-insulator-semiconductor heterostructure field-effect transistor ("MISHFET") having a predetermined breakdown voltage selectable before or during transistor fabrication to be greater than or equal to 600V, comprising:
a substrate;
a GaN buffer layer coupled to the substrate, the GaN buffer layer further comprising a channel;
an InAlN barrier layer coupled to the GaN buffer layer;
a first dielectric layer coupled to the InAlN barrier layer, the first dielectric layer comprising a first dielectric material having a first predetermined thickness and a first relative permittivity;
a gate coupled to the first dielectric layer and disposed in a recess in the InAlN barrier layer, the gate having a first side and a second side opposite the first side;
a source coupled to the InAlN barrier layer and spaced apart from the first side of the gate;
a drain coupled to the InAlN barrier layer and spaced apart from the second side of the gate; and
a second dielectric layer coupled to the first dielectric layer, to the gate, to the source and to the drain, the second dielectric layer comprising a second high-k dielectric material having a second relative permittivity, the second relative permittivity greater than or equal to twenty (20), and the second dielectric layer having a second predetermined thickness greater than 200 nm.

* * * * *